(12) United States Patent
Ogawa et al.

(10) Patent No.: US 10,541,145 B2
(45) Date of Patent: Jan. 21, 2020

(54) SUBSTRATE PROCESSING APPARATUS AND SUBSTRATE PROCESSING METHOD

(71) Applicant: TOKYO ELECTRON LIMITED, Tokyo (JP)

(72) Inventors: Hiroyuki Ogawa, Yamanashi (JP); Tomoya Okubo, Yamanashi (JP); Akitaka Shimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/940,528

(22) Filed: Mar. 29, 2018

(65) Prior Publication Data

US 2018/0286696 A1 Oct. 4, 2018

(30) Foreign Application Priority Data

Mar. 29, 2017 (JP) .................................. 2017-065992
Feb. 6, 2018 (JP) .................................. 2018-019439

(51) Int. Cl.
*H01L 21/31* (2006.01)
*H01L 21/311* (2006.01)
*H01J 37/32* (2006.01)

(52) U.S. Cl.
CPC .... *H01L 21/31116* (2013.01); *H01J 37/3244* (2013.01); *H01J 37/32458* (2013.01); *H01J 2237/334* (2013.01)

(58) Field of Classification Search
CPC .......... H01L 21/31116; H01L 21/67017; H01J 37/32458; H01J 37/3244; H01J 2237/334

USPC ............... 118/719, 715; 156/345.31, 345.32, 156/345.33, 345.34
See application file for complete search history.

(56) References Cited

U.S. PATENT DOCUMENTS 5,884,009 A * 3/1999 Okase ............... H01L 21/67017
219/405
5,958,140 A * 9/1999 Arami ............... C23C 16/45502
118/725
6,444,039 B1 * 9/2002 Nguyen ................ C23C 16/455
118/715

(Continued)

FOREIGN PATENT DOCUMENTS

JP 2006-324023 A 11/2006
JP 5192214 B2 5/2013
(Continued)

*Primary Examiner* — Rudy Zervigon
(74) *Attorney, Agent, or Firm* — Fenwick & West LLP

(57) ABSTRACT

In a substrate processing apparatus for processing a substrate mounted on a mounting table in a processing chamber by supplying a gas to the substrate, the apparatus includes: a partition unit provided, between a processing space where a substrate is provided and a diffusion space where a first gas is diffused, to face the mounting table; a first gas supply unit for supplying the first gas to the diffusion space; first gas injection holes, formed through the partition unit, for injecting the first gas diffused in the diffusion space into the processing space; and a second gas supply unit including second gas injection holes opened on a gas injection surface of the partition unit which faces the processing space. The second gas supply unit independently supplies a second gas to each of a plurality of regions arranged in a horizontal direction in the processing space separately from the first gas.

18 Claims, 21 Drawing Sheets

(56) References Cited

U.S. PATENT DOCUMENTS

| | | | |
|---|---|---|---|
| 7,666,479 B2* | 2/2010 | Strang | C23C 16/45523 118/663 |
| 8,100,081 B1* | 1/2012 | Henri | C23F 4/00 118/723 ER |
| 8,236,106 B2* | 8/2012 | Iizuka | C23C 16/4412 118/50 |
| 8,397,668 B2* | 3/2013 | Kobayashi | H01J 37/32082 118/715 |
| 8,506,713 B2* | 8/2013 | Takagi | C23C 16/409 118/715 |
| 8,539,908 B2* | 9/2013 | Takagi | C23C 16/45521 118/696 |
| 8,551,890 B2* | 10/2013 | Goodlin | C23C 16/45565 118/715 |
| 8,882,913 B2* | 11/2014 | Byun | C23C 16/40 118/715 |
| 9,055,661 B2* | 6/2015 | Tanaka | H05H 1/46 |
| 9,425,028 B2* | 8/2016 | Kuwabara | C23C 16/509 |
| 9,905,400 B2* | 2/2018 | Stowell | H01J 37/32119 |
| 9,976,215 B2* | 5/2018 | Chou | C23C 16/45565 |
| 10,094,019 B2* | 10/2018 | Toriya | C23C 16/45544 |
| 10,145,012 B2* | 12/2018 | Je | C23C 16/45565 |
| 2006/0011298 A1* | 1/2006 | Lim | C23C 16/45514 156/345.34 |
| 2006/0016559 A1* | 1/2006 | Kobayashi | H01J 37/32082 156/345.34 |
| 2006/0021574 A1* | 2/2006 | Armour | C23C 16/45565 118/715 |
| 2006/0042754 A1* | 3/2006 | Yoshida | H01J 37/32091 156/345.1 |
| 2006/0112876 A1* | 6/2006 | Choi | C23C 16/45563 118/715 |
| 2006/0169671 A1* | 8/2006 | Miya | H01J 37/3244 216/67 |
| 2006/0191637 A1* | 8/2006 | Zajac | B81C 1/00547 156/345.34 |
| 2006/0263522 A1* | 11/2006 | Byun | C23C 16/45519 427/248.1 |
| 2007/0066038 A1* | 3/2007 | Sadjadi | H01J 37/32091 438/478 |
| 2007/0175391 A1* | 8/2007 | Mizusawa | C23C 16/455 118/689 |
| 2007/0181181 A1* | 8/2007 | Mizusawa | C23C 16/45565 137/1 |
| 2007/0181255 A1* | 8/2007 | Hayasaka | C23C 16/455 156/345.33 |
| 2007/0247075 A1* | 10/2007 | Kim | H01J 37/321 315/111.21 |
| 2007/0249173 A1* | 10/2007 | Kim | H01J 37/32091 438/711 |
| 2007/0251642 A1* | 11/2007 | Bera | H01J 37/32082 156/345.26 |
| 2007/0251917 A1* | 11/2007 | Bera | H01J 37/321 216/58 |
| 2007/0251918 A1* | 11/2007 | Bera | H01J 37/321 216/58 |
| 2007/0254483 A1* | 11/2007 | Bera | H01J 37/3244 438/689 |
| 2007/0254486 A1* | 11/2007 | Bera | H01J 37/32091 438/706 |
| 2008/0078746 A1* | 4/2008 | Masuda | H01J 37/3244 216/79 |
| 2008/0178805 A1* | 7/2008 | Paterson | H01J 37/32091 118/723 I |
| 2008/0179011 A1* | 7/2008 | Collins | C23C 16/45574 156/345.44 |
| 2009/0042321 A1* | 2/2009 | Sasaki | H01J 37/32449 438/10 |
| 2009/0065147 A1 | 3/2009 | Morita | |
| 2009/0117746 A1* | 5/2009 | Masuda | C23C 16/45561 438/710 |
| 2009/0159213 A1* | 6/2009 | Bera | H01J 37/3244 156/345.34 |
| 2009/0162261 A1* | 6/2009 | Baera | H01J 37/3244 422/186.04 |
| 2009/0162262 A1* | 6/2009 | Bera | H01J 37/3244 422/186.04 |
| 2009/0169744 A1* | 7/2009 | Byun | C23C 16/40 427/255.28 |
| 2009/0218317 A1* | 9/2009 | Belen | C23C 16/45565 216/67 |
| 2009/0275206 A1* | 11/2009 | Katz | H01J 37/3244 438/714 |
| 2010/0119727 A1* | 5/2010 | Takagi | C23C 16/45521 427/532 |
| 2010/0190341 A1* | 7/2010 | Park | C23C 16/045 438/694 |
| 2010/0243166 A1* | 9/2010 | Hayashi | H01J 37/32568 156/345.34 |
| 2011/0212625 A1* | 9/2011 | Toyoda | C23C 16/4412 438/758 |
| 2011/0256729 A1* | 10/2011 | Goodlin | C23C 16/45565 438/758 |
| 2012/0111271 A1* | 5/2012 | Begarney | C23C 16/45508 118/724 |
| 2012/0211164 A1* | 8/2012 | Shah | H01J 37/32366 156/345.31 |
| 2012/0258259 A1* | 10/2012 | Bansal | C23C 16/0272 427/558 |
| 2013/0014895 A1* | 1/2013 | Kawamata | H01J 37/32091 156/345.33 |
| 2013/0109159 A1* | 5/2013 | Carlson | C23C 16/45565 438/503 |
| 2014/0370691 A1* | 12/2014 | Yamada | C30B 25/14 438/478 |
| 2015/0228457 A1* | 8/2015 | Yamashita | H01L 21/3065 216/67 |
| 2017/0047200 A1* | 2/2017 | Lee | H01J 37/3244 |
| 2017/0283985 A1* | 10/2017 | Takahashi | C30B 25/14 |
| 2018/0166298 A1* | 6/2018 | Kagaya | H01L 21/67 |
| 2019/0177851 A1* | 6/2019 | Ivanov | H01J 37/32724 |

FOREIGN PATENT DOCUMENTS

| | | |
|---|---|---|
| KR | 10-0446486 B1 | 9/2004 |
| KR | 10-0731164 B1 | 6/2007 |

\* cited by examiner

SUBSTRATE PROCESSING APPARATUS AND SUBSTRATE PROCESSING METHOD

CROSS-REFERENCE TO RELATED APPLICATIONS

This application claims priority to Japanese Patent Application Nos. 2017-065992 and 2018-019439 respectively filed on Mar. 29, 2017 and Feb. 6, 2018, the entire contents of which are incorporated herein by reference.

FIELD OF THE INVENTION

The present disclosure relates to a technique for performing processing by supplying a gas to a substrate accommodated in a processing chamber.

BACKGROUND OF THE INVENTION

A semiconductor manufacturing process includes plasma processing in which etching, film formation, or the like is performed by a plasma of a reactant gas. As for an apparatus for performing such plasma processing, there is known a plasma processing apparatus disclosed in Japanese Patent Application Publication No. 2006-324023. In this plasma processing apparatus, a plasma is generated by exciting a processing gas at an upper portion in a processing chamber and radicals that have passed through an ion trap unit are supplied to a substrate.

When the processing gas is excited in the processing chamber during the plasma processing, there may be employed, e.g., a method for supplying a high frequency power to an antenna, generating an induced electric field in the processing chamber, exciting the processing gas supplied into the processing chamber, and supplying the excited processing gas to a semiconductor wafer (hereinafter, referred to as "wafer"). Since, however, the induced electric field for exciting the processing gas in a space is not uniform, plasma distribution tends to be non-uniform. Further, plasma distribution is easily affected by a magnetic field or an electric field and it is difficult to control a density thereof. Therefore, it is difficult to obtain uniform in-plane distribution of radicals supplied to the wafer. Recently, along with miniaturization of a circuit pattern formed on a wafer, a higher accuracy is required for the in-plane uniformity of the wafer processing. Accordingly, there is required a technique for controlling in-plane distribution of the processing on the substrate in a processing module.

Japanese Patent No. 5192214 discloses a technique for adjusting concentration of a gas by supplying an additional gas to a peripheral portion of a wafer W and adjusting in-plane uniformity of the wafer W. However, it is disadvantageous in that the additional gas is difficult to be supplied to a central portion of the wafer W. In addition, an example in which a processing gas is turned into a plasma and the plasma thus generated is supplied to the wafer is not considered.

SUMMARY OF THE INVENTION

In view of the above, the present disclosure provides a technique capable of adjusting in-plane uniformity of concentration of a gas in supplying the gas to a substrate in a processing chamber.

In accordance with an aspect, there is provided a substrate processing apparatus for processing a substrate mounted on a mounting table in a processing chamber by supplying a gas to the substrate. The substrate processing apparatus includes: a partition unit provided, between a processing space where a substrate is provided and a diffusion space where a first gas is diffused, to face the mounting table; a first gas supply unit configured to supply the first gas to the diffusion space; a plurality of first gas injection holes formed through the partition unit in a thickness direction thereof and configured to inject the first gas diffused in the diffusion space into the processing space; and a second gas supply unit including a plurality of second gas injection holes opened on a gas injection surface of the partition unit which faces the processing space and configured to independently supply a second gas to each of a plurality of regions arranged in a horizontal direction in the processing space separately from the first gas.

In accordance with another aspect, there is provided a substrate processing method using the substrate processing apparatus disclosed above. The substrate processing method includes: etching a silicon nitride film formed on a surface of the substrate by activating the first gas supplied into the diffusion space and supplying the activated first gas into the processing space; adjusting distribution of the activated first gas in the processing space by supplying the second gas to the plurality of regions in the processing space; and supplying an oxide film removing gas for removing an oxide film on the surface of the silicon nitride film from the first gas supply unit to the processing space through the diffusion space or from the second gas supply unit to the processing space.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS (First Embodiment)

Figure 1:
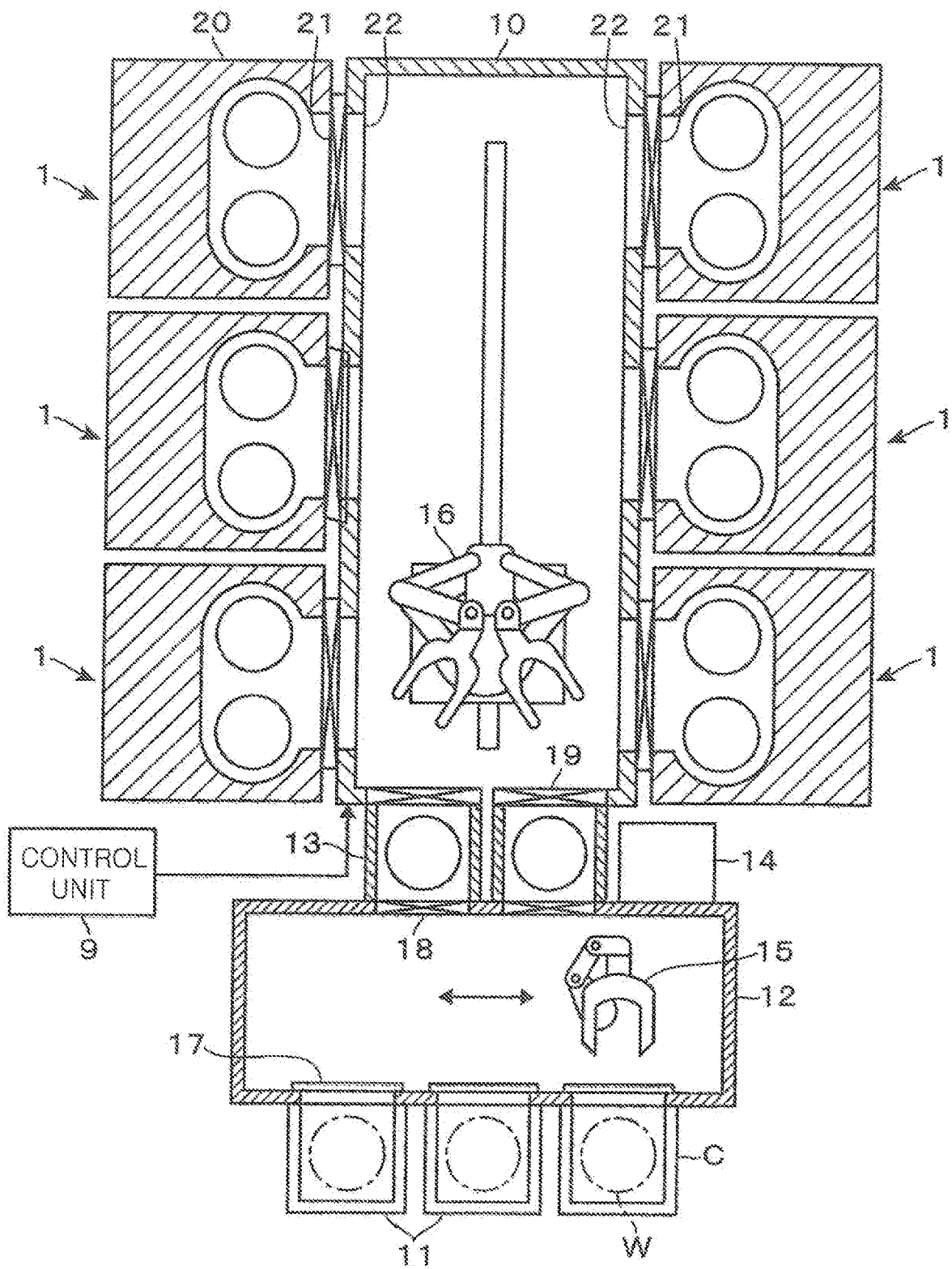
FIG. 1 is a plan view of a multi-chamber system according to a first embodiment.

An example in which a substrate processing apparatus according to a first embodiment is applied to a plasma processing apparatus will be described. FIG. 1 shows a vacuum processing apparatus that is a multi-chamber system including a plasma processing apparatus. The vacuum processing apparatus includes a longitudinally elongated normal pressure transfer chamber 12 set to a normal pressure atmosphere by a dry gas, e.g., a dry nitrogen gas. Three load ports 11 for mounting thereon respective transfer containers C are arranged side by side in front of the normal pressure transfer chamber 12.

A door 17 that is opened and closed together with a lid of the transfer container C is attached to a front wall of the normal pressure transfer chamber 12. A transfer mechanism 15 configured as a multi-joint arm for transferring a wafer W is provided in the normal pressure transfer chamber 12. Two load-lock chambers 13, for example, are arranged side by side at a side of the normal pressure transfer chamber 12 which is opposite to the side where the load ports 11 are provided. Gate valves 18 are provided between the load-lock chambers 13 and the normal pressure transfer chamber 12. A vacuum transfer chamber 10 is provided at a rear side of the load-lock chambers 13, when viewed from the normal pressure transfer chamber 12 side, with a gate valves 19 provided between the vacuum transfer chamber 10 and each of the load-lock chambers 13.

Process modules 1 for performing, e.g., film formation, PHT (Post Heat Treatment) and plasma processing are connected to the vacuum transfer chamber 10. A transfer mechanism 16 having two transfer arms, each being configured as a multi-joint arm, is provided in the vacuum transfer chamber 10. A wafer W is transferred between each of the load-lock chambers 13 and each of the process modules 1 by the transfer mechanism 16. A cooling unit 14 for cooling the wafer W is connected to the normal pressure transfer chamber 12 in the vacuum processing apparatus. For example, a film forming apparatus forms a silicon nitride (SiN) film on a wafer W and a PHT apparatus sublimates reaction products generated during plasma processing by heating the wafer W subjected to the plasma processing.

Figure 2:
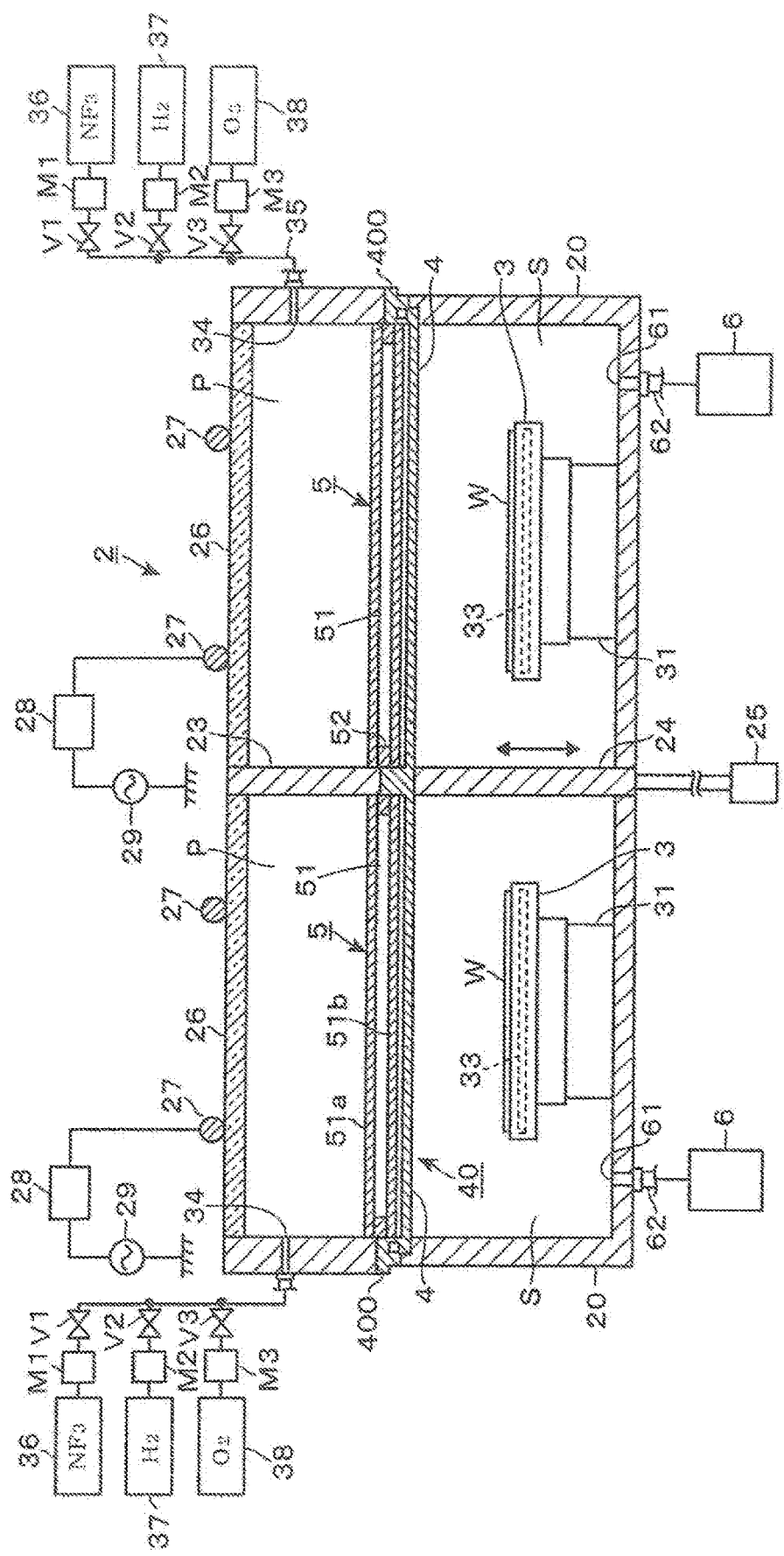
FIG. 2 is a vertical cross sectional view of a plasma processing apparatus according to the first embodiment.

Next, among the process modules 1 provided in the vacuum processing apparatus, a plasma processing apparatus 2 will be described with reference to FIG. 2. Here, a plasma processing apparatus for etching the SiN film formed on the wafer W by using radicals generated by exciting nitrogen trifluoride ($NF_3$) gas, oxygen ($O_2$) gas, and ($H_2$) gas. The plasma processing apparatus 2 includes a processing chamber 20 that is a vacuum container made of metal such as aluminum or the like. As shown in FIG. 2, the plasma processing apparatus includes two processing chambers 20 connected side by side in a right-left direction. A transfer port 22 that is commonly used for two processing chambers 20 is formed at one surface in a back-and-forth direction of the two connected processing chambers 20 to transfer the wafer W between the two processing chambers 20 and the vacuum transfer chamber 10 shown in FIG. 1. The transfer port 22 can be opened and closed by the gate valves 21.

As shown in FIG. 2, the connected processing chambers 20 are partitioned by a partition wall 23 provided at an upper side and a partition wall 24 provided below the partition wall 23. The partition wall 24 is configured to be moved up and down by, e.g., an elevation mechanism 25. In a state where the partition wall 24 is lowered, processing spaces where mounting tables 3 of the two processing chambers 20 are provided communicate with each other and the wafer W can be loaded into each of the processing chambers 20. However, the two processing spaces are partitioned from each other by raising the partition wall 24. The two processing chambers 20 in the plasma processing apparatus 2 have substantially the same configuration. Therefore, one of the processing chamber 20 will be described hereinafter.

As shown in FIGS. 1 and 2, a mounting table 3 for horizontally supporting the wafer W is provided in the processing chamber 2. A temperature control passage 33 is formed in the mounting table 3. A temperature control medium such as water or the like passes through the temperature control passage. In radical treatment to be described later, a temperature of the wafer W is controlled to, e.g., about 10° C. to 120° C. The mounting table 3 is provided with three elevating pins (not shown) spaced apart from each other at a regular interval in a circumferential direction and configured to project from a top surface of the mounting table.

A dielectric window 26 formed of, e.g., a quartz plate or the like, is provided at a top plate portion of each processing chamber 20. A high frequency antenna 27 formed of a spiral planar coil is provided on an upper surface of each dielectric window 26. A high frequency power supply 29 for outputting a high frequency power of, e.g., 200 W to 1200 W, is connected to an end portion of the coil-shaped high frequency antenna 27 via a matching unit 28. The high frequency antenna 27, the matching unit 28, and the high frequency power supply 29 correspond to a plasma generation unit.

A gas supply port 34 for supplying a first gas is formed at each processing chamber 20. One end of a gas supply line 35 is connected to the gas supply port 34. The other end of the gas supply line 35 is branched into three lines connected to an $NF_3$ gas supply source 36, an $H_2$ gas supply source 37, and an $O_2$ gas supply source 38, respectively. In FIG. 2, notations V1 to V3 represent valves and notations M1 to M3 represent flow rate controllers. Accordingly, $NF_3$ gas, $H_2$ gas and $O_2$ gas can be supplied into the processing chamber 20 at predetermined flow rates. These gases supplied through the gas supply port 34 correspond to the first gas.

Provided above the mounting table 3 in the processing chamber is a partition unit 5 for partitioning an inner space of the processing chamber 20 into a plasma space P where the $NF_3$ gas, the $O_2$ gas and the $H_2$ gas in the processing chamber 20 are diffused and a plasma is excited and a processing space S where the wafer W mounted on the mounting table 3 is subjected to radical treatment.

The partition unit 5 includes a shower plate 4 and an ion trap unit 51 which are disposed in this order from a lower side. The shower plate 4 and the ion trap unit 51 have different thermal expansion coefficients and, thus, friction therebetween may generate particles. Accordingly, the shower plate 4 and the ion trap unit 51 are separated from each other without contact by using, e.g., a spacer or the like.

Figure 3:
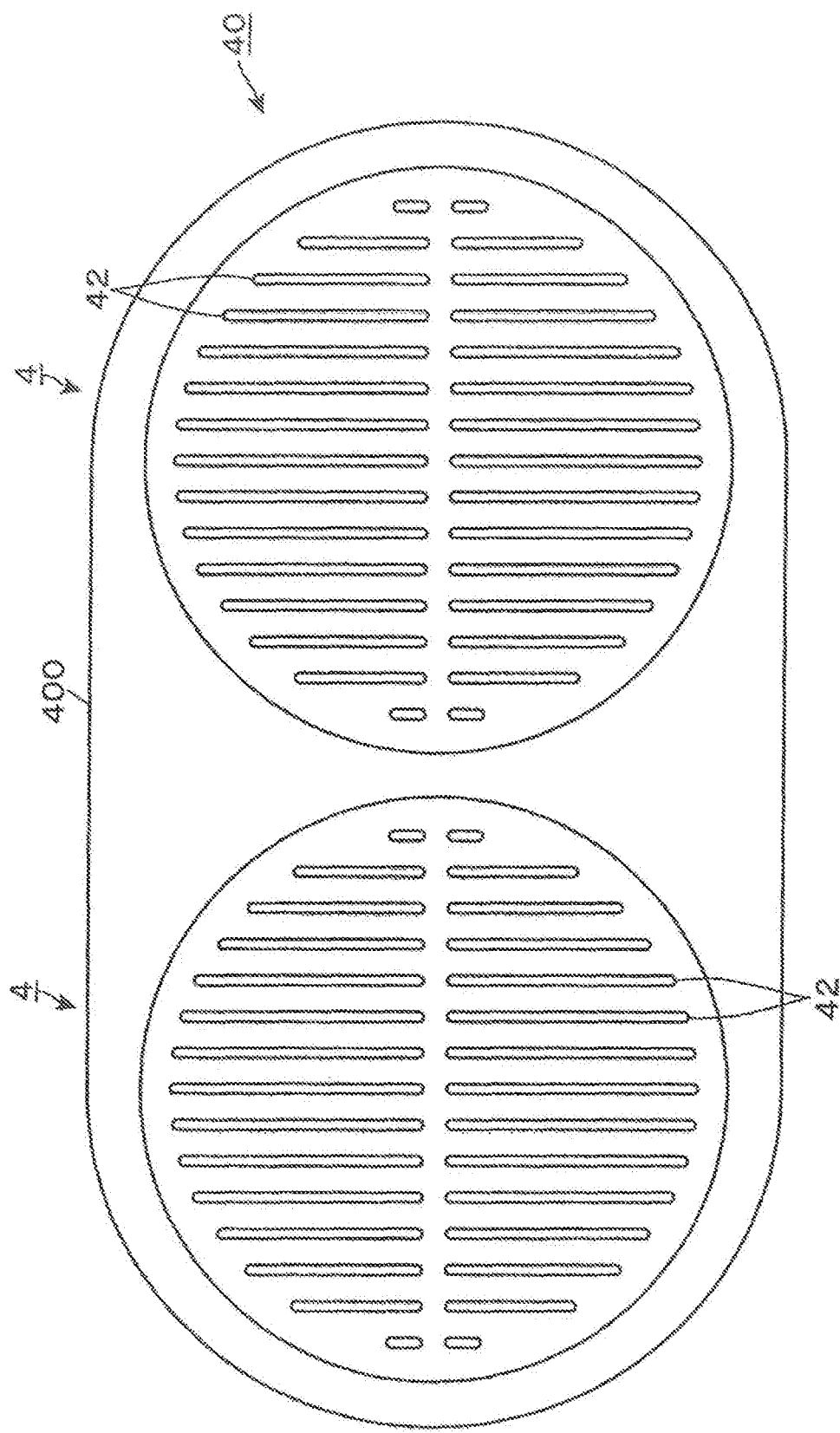
FIG. 3 is a plan view of a shower plate when viewed from the top.
Figure 4:
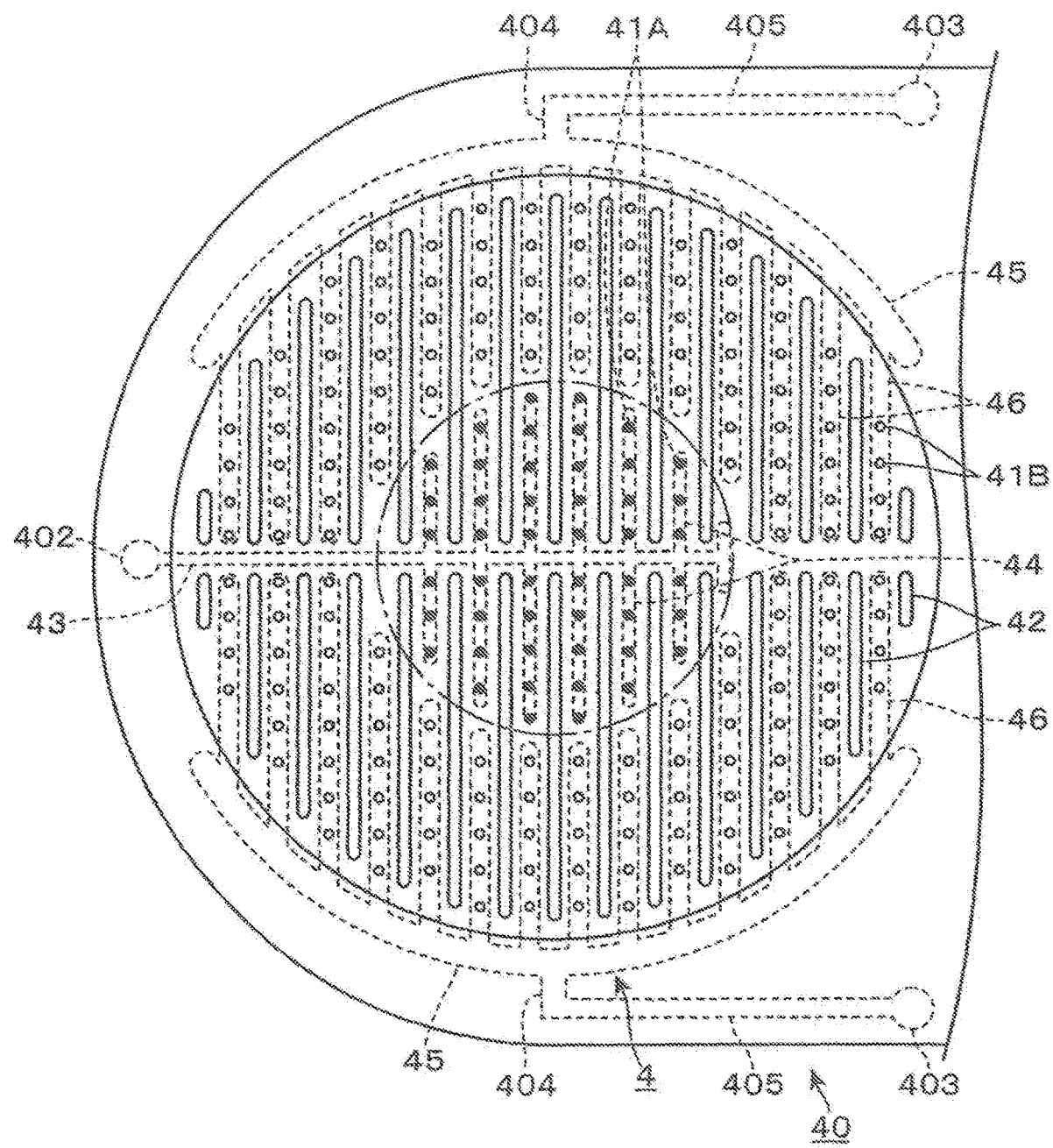
FIG. 4 is a plan view of the shower plate when viewed from the bottom.
Figure 5:
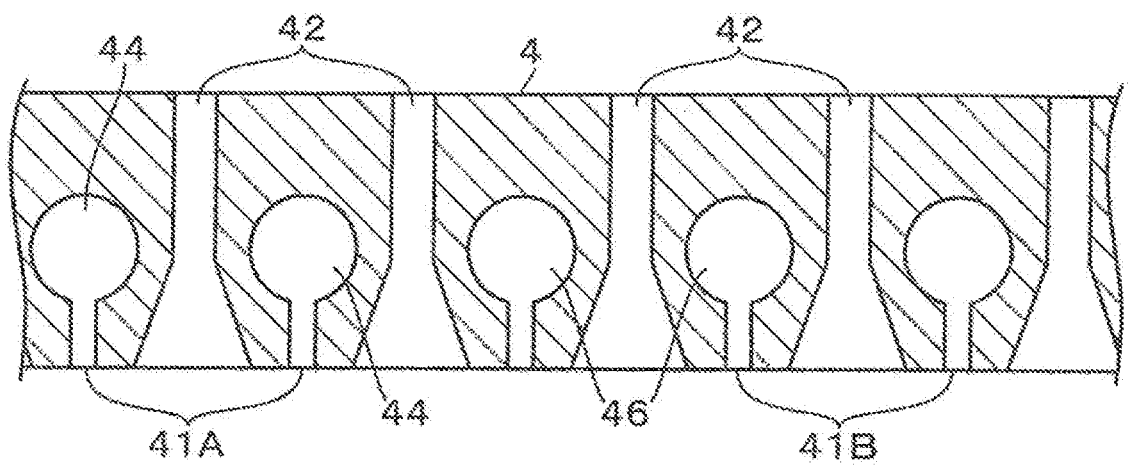
FIG. 5 is a vertical cross sectional view of the shower plate.
Figure 6:
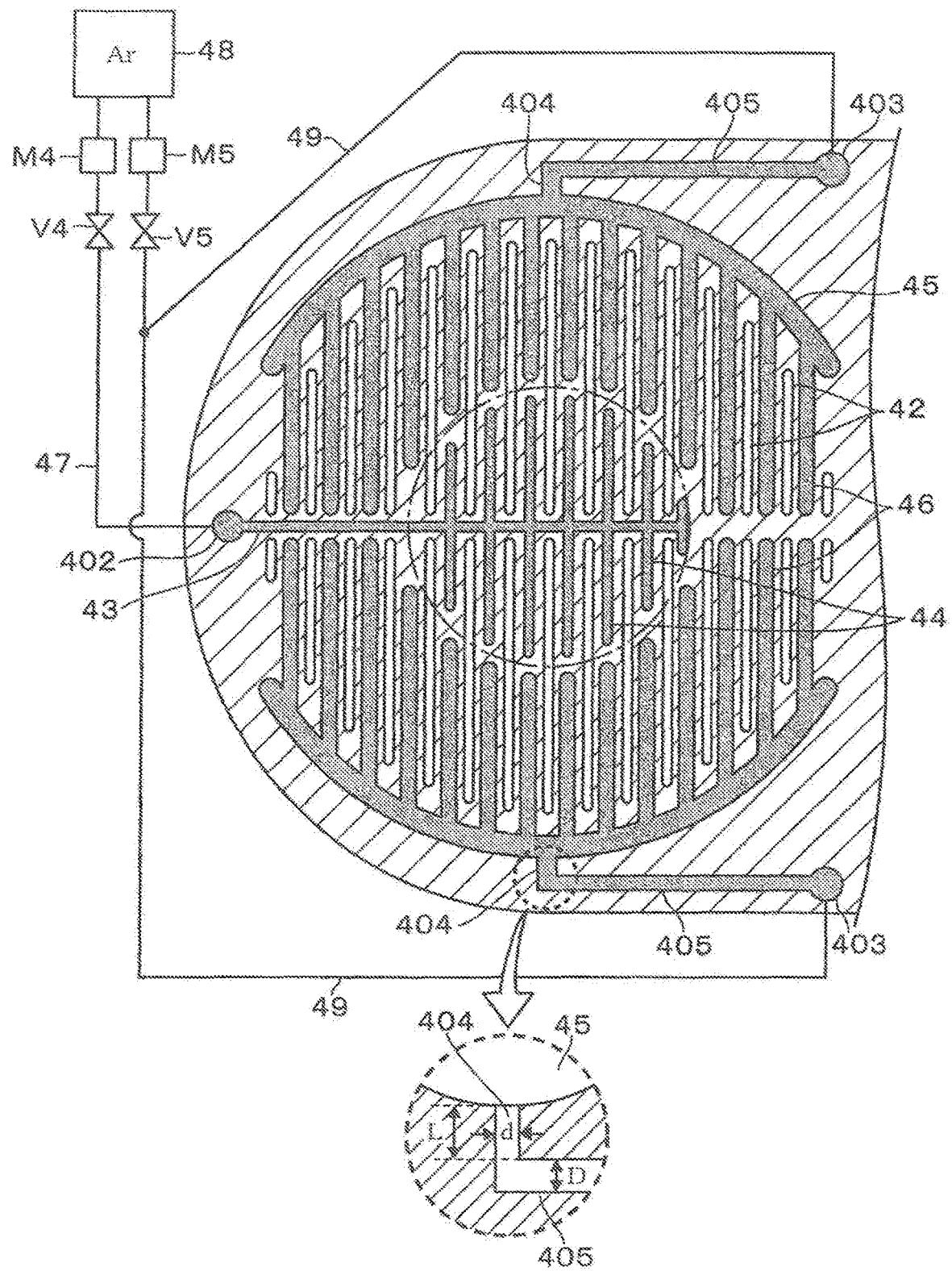
FIG. 6 is a horizontal cross sectional view of the shower plate.
Figure 7:
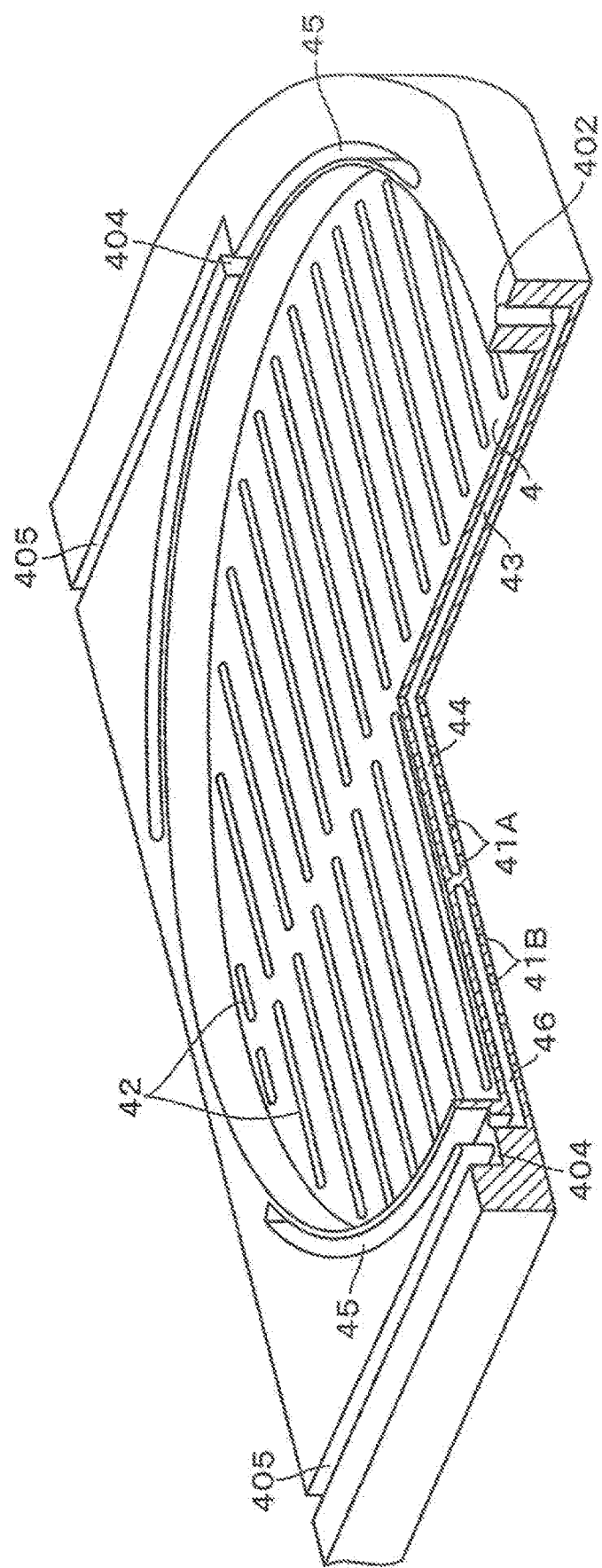
FIG. 7 is a cross sectional perspective view of the shower plate.

The shower plate 4 will be described with reference to FIGS. 3 to 7. FIG. 3 shows the shower plate 4 provided in each processing chamber 20 when viewed from the top. FIG. 4 is a plan view of the shower plate 4 in one of the processing chambers 20 when viewed from the mounting table 3. FIG. 5 is a vertical cross sectional view of the shower plate 4. FIG. 6 is a horizontal cross sectional view of the shower plate 4 when viewed from the mounting table 3. FIG. 7 is a cross sectional perspective view of the shower plate 4. Although ceiling surfaces of a gas diffusion passage 45 and a gas introducing passage 405 formed in a flange 400 are closed by a plate-shaped member, it is illustrated in FIG. 7 that the ceiling surfaces of the gas diffusion passage 45 and the gas introducing passage 405 are opened, for convenience of explanation. As will be described later, a channel for supplying an inert gas, e.g., argon (Ar) gas, serving as a second gas is formed at a side of the shower plate 4 which faces the processing space S. However, in FIG. 2, the cross section of the shower plate 4 is indicated as oblique lines because of difficulty in drawing, and the channel to be described later is not shown. The shower plate 4 is, e.g., an aluminum plate. As shown in FIG. 3, the shower plates 4 that partition the inner spaces of the respective processing chambers 20 are connected and configured as a single plate-shaped body 40.

The flange 400 is formed around the shower plates 4 in the plate-shaped body 40. The shower plates 4 are fixed by inserting the flange 400 into a circumferential wall of each processing chamber 20. The heat of the shower plates 4 passes through an inner wall of the processing chamber 20 via the flange 400 and is diffused. A coolant passage may be formed in the flange 400 so that the shower plates 4 can be cooled.

As shown in FIGS. 3 and 4, on the assumption that the processing chambers 20 are arranged in a right-left direction, in two semicircular regions obtained by dividing the shower plate 4 into two in the back-and-forth direction, slits 42 extending in a back-and-forth direction and penetrating through the shower plate 4 in a thickness direction thereof are arranged in the right-left direction. As shown in FIG. 5, each of the slits 42 has a width greater than that formed in the ion trap unit 51 to be described later, the width being increased toward a bottom opening thereof. A bottom end portion of an opening of each of the slits 42 is chamfered so that a decrease in a conductance of a gas passing through the slits 42 is suppressed.

As shown in FIGS. 4 and 6, a gas supply path 43 is formed in the shower plate 4 to extend in the right-left direction (the arrangement direction of the processing chambers 20) between the semicircular regions where the slits 42 are formed. A plurality of central gas supply paths 44 branched from the gas supply path 43 in a direction perpendicular thereto (back-and-forth direction) are each formed between the adjacent slits 42 in a circular region (central region) around the center of the shower plate 4. As shown in FIGS. 4, 6 and 7, an end portion on a peripheral side of the shower plate 4 in the gas supply path 43 is connected to a central gas introducing port 402 formed in the flange 400. An Ar gas supply source 48 is connected to the central gas introducing port 402 through a central gas supply line 47. A flow rate controller M4 and a valve V4 are provided in the central gas supply line 47 from an upstream side. As shown in FIGS. 4, 5 and 7, central gas injection holes 41A that are opened on a gas injection surface, i.e., a surface of the shower plate 4 which faces the mounting table 3, are distributed in the central gas supply path 44. The gas supply path 43, the central gas supply path 44, the central gas introducing port 402, the central gas supply line 47, the Ar gas supply source 48, the flow rate controller M4, the valve V4 and the central gas injection holes 41A correspond to a central gas supply unit.

As shown in FIGS. 4, 6 and 7, the gas diffusion passage 45 extending in an arc shape along the peripheral portion of the shower plate 4 is formed in the flange 400 at the front side and the rear side of the shower plate 4, and a peripheral gas supply path 46 branched from the gas diffusion passage 45 and extending in the back-and-forth direction is formed between the adjacent slits 42 in the peripheral region around the central region of the shower plate 4. In each gas diffusion passage 45, a connection passage 404 is extended from a longitudinal center position of the gas diffusion passage 45 toward a peripheral side of the plate-shaped body 40 in the back-and-forth direction. More specifically, the gas diffusion passage 45 has an arc shape as described above, and the connection passage 404 is formed along a direction normal to the arc. An upstream end of the connection passage 404 is connected to a peripheral side gas introducing passage 405. The peripheral side gas introducing passage 405 extends in a direction perpendicular to the extension direction of the connection passage 404 toward the central portion in the right-left direction of the plate-shaped body 40. An upstream end of the peripheral side gas introducing passage 405 is connected to a peripheral side gas introduction port 403.

An enlarged view of the connection passage 404 and the gas diffusion passage 45 is shown within a dotted circle indicated by an arrow in FIG. 6. As shown in FIG. 6, a width d of the connection passage 404 is smaller than a width D of the peripheral side gas introducing passage 405 (D>d). For example, the width D of the peripheral side gas introduction path 405 is about 4 mm to 10 mm and the width d of the connection passage 404 is about 2 mm to 6 mm. A length L of the connection passage 404 is greater than the width d of the connection passage 404 by twice or more (L≥2d). The length L of the connection passage 404 is, e.g., about 4 mm to 12 mm.

The Ar gas supply source 48 is connected to the peripheral side gas introduction port 403 through a peripheral side gas supply line 49. A flow rate controller M5 and a valve V5 are sequentially provided in the peripheral side gas supply line 49 from an upstream side. As shown in FIGS. 4, 5 and 7, peripheral gas injection holes 41B that open to the surface of the shower plate 4 which faces the mounting table 3 are distributed in the peripheral gas supply path 46. The gas diffusion passage 45, the peripheral gas supply path 46, the peripheral side gas introduction port 403, the connection passage 404, the peripheral side gas introduction path 405, the peripheral side gas supply line 49, the Ar gas supply source 48, the flow rate controller M5, the valve V5, and the peripheral gas injection holes 41B correspond to a peripheral gas supply unit. In FIG. 4, the central gas injection holes 41A are indicated by black dots and the peripheral gas injection holes 41B are indicated by white dots.

Figure 8:
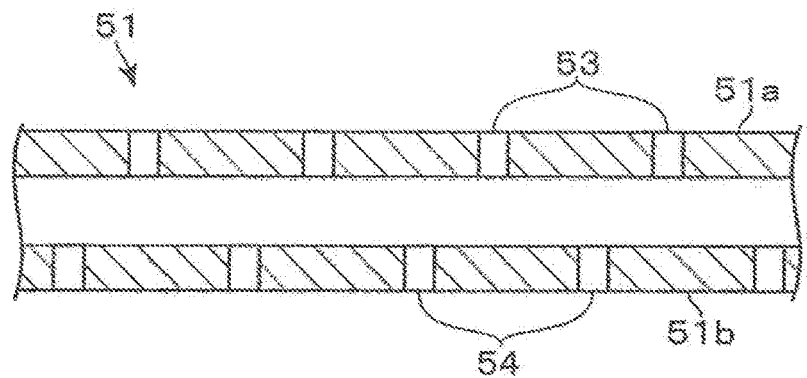
FIG. 8 is a cross sectional view of an ion trap unit.
Figure 9:
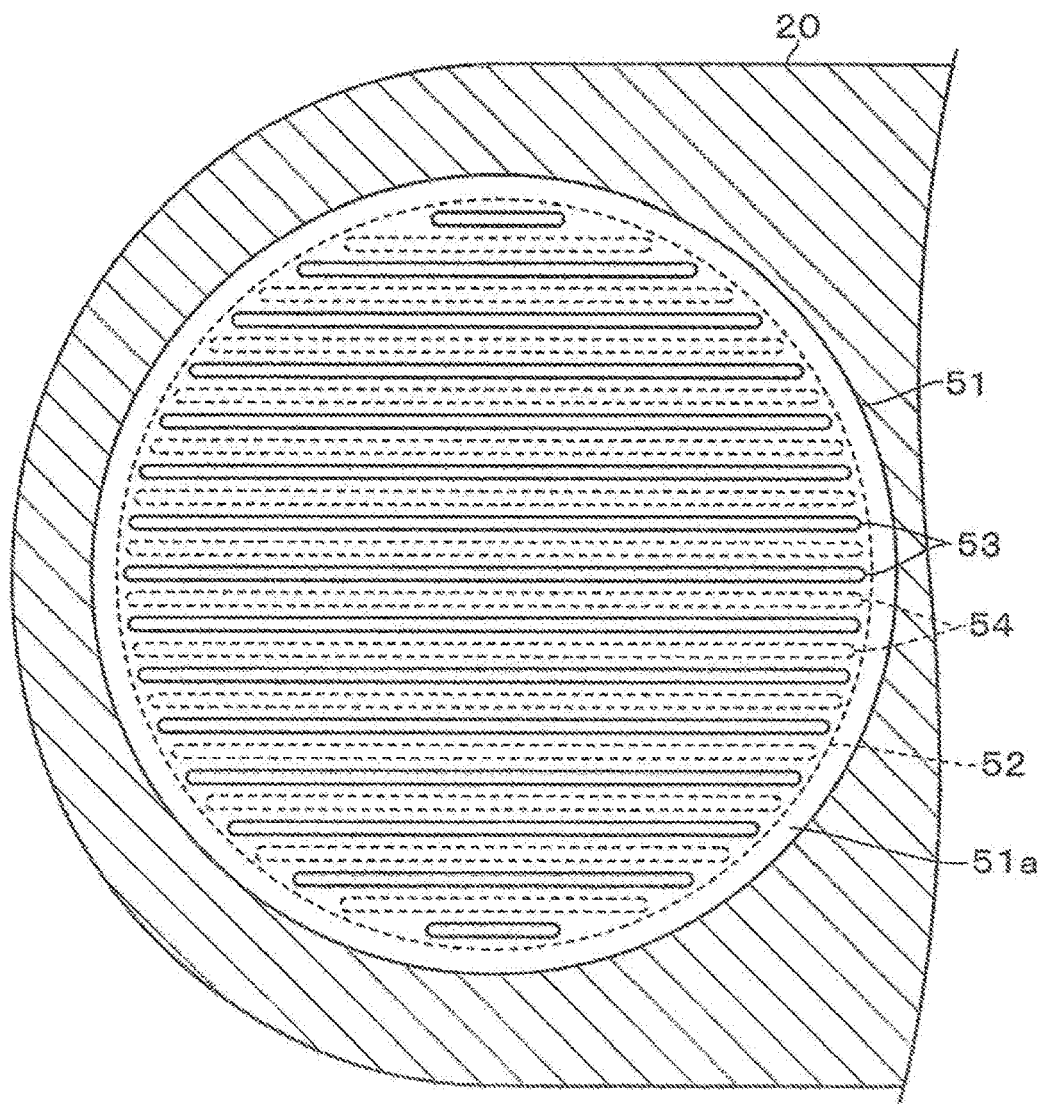
FIG. 9 is a plan view of the ion trap unit.

As shown in FIG. 8, the ion trap unit 51 includes, e.g., two quartz plates 51a and 51b arranged in a vertical direction. A spacer 52 made of, e.g., quartz, is provided between the two quartz plates 51a and 51b along the peripheral portion. The two quartz plates 51a and 51b face each other with a gap therebetween. As shown in FIGS. 8 and 9, a plurality of slits 53 and 54 penetrate through the quartz plates 51a and 51b, respectively, in the thickness direction thereof and extend in the right-left direction. The slits 53 and 54 formed in the quartz plates 51a and 51b are alternately arranged without overlapping with each other when viewed from the top. In FIGS. 3 to 9, the slits 42, 53 and 54, the central gas injection holes 41A, and the peripheral gas injection holes 41B are schematically illustrated. The arrangement interval or the number of the slits and the injection holes are not accurately illustrated.

In the first embodiment, the slits 42, 53 and 54 formed in the shower plate 4 and the ion trap unit 51 correspond to first gas supply holes.

Referring back to FIG. 2, a gas exhaust port 61 is opened on the bottom surface of the processing chamber 20, and a gas exhaust line 62 is connected to the gas exhaust port 61. A vacuum evacuation unit 6 such as a vacuum pump or the like is connected to the gas exhaust line 62 through a pressure control valve, e.g., a pendulum valve or the like. Accordingly, a pressure in the processing chamber 20 can be reduced to a predetermined vacuum level.

As shown in FIG. 1, the vacuum processing apparatus includes a control unit 9. The control unit 9 includes a program, a memory, and a CPU. The program is stored in a computer storage medium, e.g., a compact disk, a hard disk, a magneto-optical disk or the like, and installed in the control unit 9. The program includes a group of steps so that a series of processes including transfer of the wafer W and start and stop of gas supply in the plasma processing apparatus 2 can be performed.

The operation of the above embodiment will be described. For example, when the transfer container C containing the wafers W is loaded onto the load port 11 of the vacuum processing apparatus, the wafer W is taken out from the transfer container C and transferred to the vacuum transfer chamber 10 through the normal pressure transfer chamber 12 and the load-lock chamber 13. Then, the wafer W is transferred to the film forming apparatus and a SiN film is formed. Next, the wafer W is taken out from the film forming apparatus by the transfer unit 16 and transferred to the plasma processing apparatus 2. In the plasma processing apparatus 2, the wafer W is transferred by a cooperative operation of the elevating pins of each mounting table 3 and the transfer unit 16 to be mounted on each mounting table 3. After the wafer W as an etching target is loaded, the transfer unit is retreated to the vacuum transfer chamber and the gate valve 21 is closed. Then, the partition wall 24 is raised and each processing chamber 20 is partitioned.

Then, a pressure in each processing chamber 20 is set to, e.g. 13.3 Pa to 133.3 Pa. $NF_3$ gas is supplied at a flow rate of 10 to 500 sccm. $O_2$ gas is supplied at a flow rate of 10 sccm to 1000 sccm. $H_2$ gas is supplied at a flow rate of 5 sccm to 130 sccm. Ar gas is supplied at a flow rate of 50 sccm to 1000 sccm from the central gas injection holes 41A and at a flow rate of 50 sccm to 1000 sccm from the peripheral gas injection holes 41B. Accordingly, a mixture of the $NF_3$ gas, the $O_2$ gas and the $H_2$ gas fills the plasma space C in the processing chamber 20 between the ion trap unit 51 and the dielectric window 26.

Figure 10:
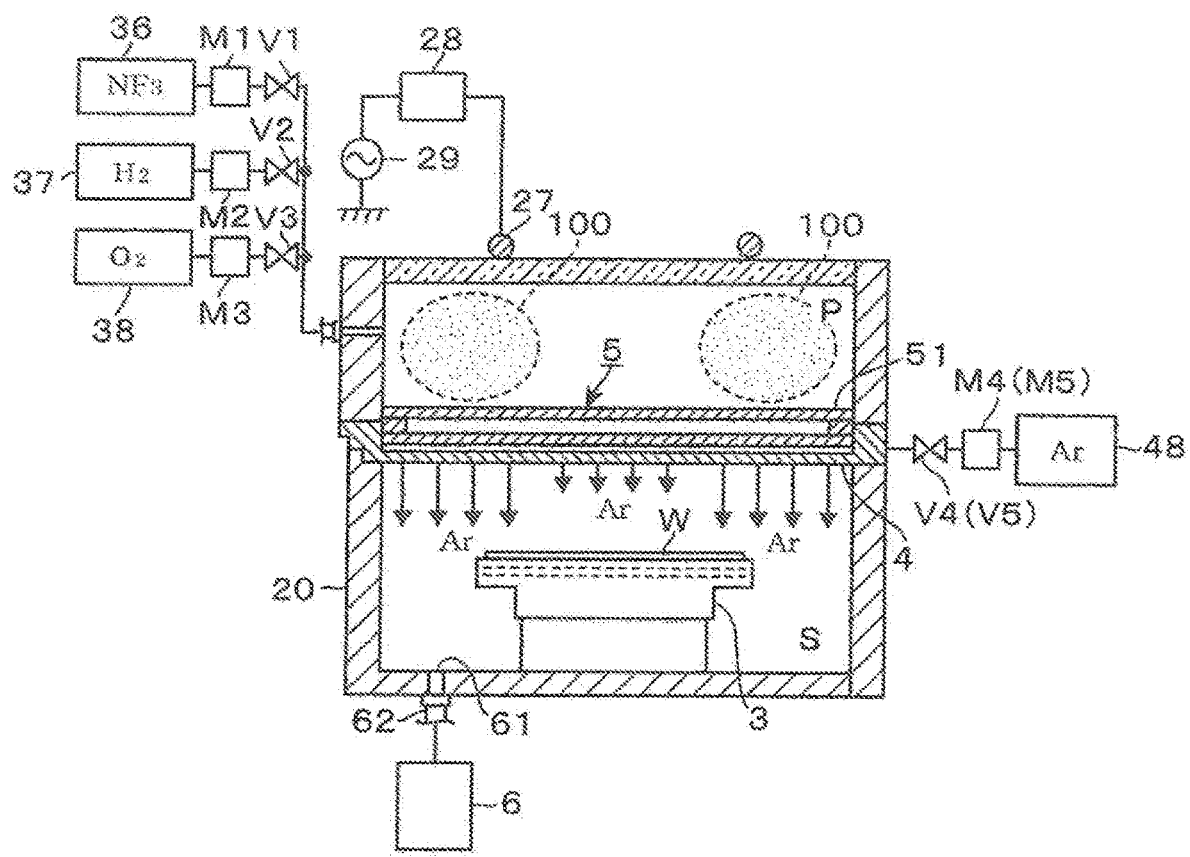
FIGS. 10 and 11 explain an operation of the plasma processing apparatus.

Thereafter, when a high frequency power of 200 W to 1200 W is applied from the high frequency power supply 29 to the high frequency antenna 27, an induced electric field is generated in the plasma space P, and the $NF_3$ gas, the $O_2$ gas and the $H_2$ gas are excited. As a consequence, a plasma 100 of the $NF_3$ gas, the 02 gas and the $H_2$ gas is generated in the plasma space P as shown in FIG. 10. Since, however, the induced electric field is generated in a donut shape, the density distribution of the plasma 100 generated in the plasma space P has a donut-shaped high density region.

Then, the plasma 100 passes through the slits 53 and 54 of the ion trap unit 51. Ions in the plasma 100 move anisotropically and thus are trapped without passing through the slits 53 and 54 of the ion trap unit 51. Radicals in the plasma move isotropically and thus pass through the ion trap unit 51 and then pass through the shower plate 4. Accordingly, the plasma of the $NF_3$ gas, the $O_2$ gas, and the $H_2$ gas pass through the ion trap unit 51, and then the concentration of radicals, e.g., F, $NF_2$, O, H and the like is increased.

The radicals such as F, $NF_2$, O and H that have passed through the ion trap unit 51 pass through the slits 42 of the shower plate 4 and enter the processing space S. In the plasma space P, the concentration of the plasma 100 tends to be distributed in a donut shape. The radicals are rectified while passing through the ion trap unit 51. Therefore, the radicals having a uniform density enter the processing space 2 to be supplied to the wafer W. However, it is difficult to obtain a completely uniform density even if the radicals pass through the ion trap unit 51 and the shower plate 4, and the density distribution of the radicals is affected by exhaust of the processing space S.

Figure 11:
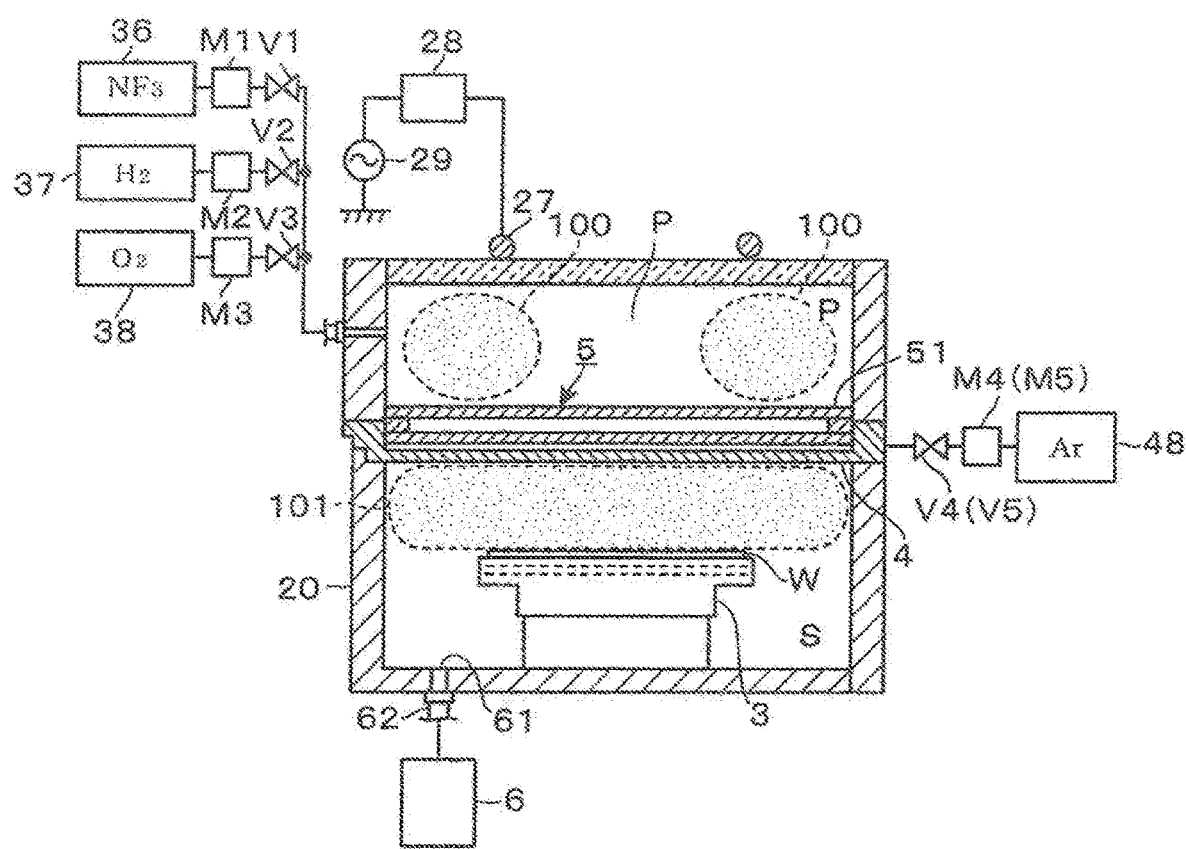

Then, the flow rate of the Ar gas supplied from the central gas injection holes 41A and the flow rate of the Ar gas supplied from the peripheral gas injection holes 41B are adjusted. The flow rate of the Ar gas to be supplied to the region where the etching amount needs to be relatively low, between the central region and the peripheral region in the processing space S, is relatively increased. For example, when the etching amount in the peripheral region of the processing space S needs to be lowered, the flow rate of the Ar gas at the peripheral region of the wafer W is increased and that at the central region of the wafer W is decreased. Accordingly, in the processing space S, a ratio at which the radicals such as F, $NF_2$, O, H and the like are diluted with Ar gas is higher at the peripheral region of the wafer W than at the central region of the wafer W and, thus, the concentration of the radicals at the center portion of the wafer W is relatively increased. As a consequence, the concentration of radicals at the center portion of the wafer W and that at the peripheral portion of the wafer W become the same, as shown in FIG. 11. As a result, the concentration distribution of the radicals 101 in the processing space S becomes uniform, and the in-plane uniformity of etching of the wafer W is improved. The distribution of the radicals such as F, $NF_2$, O, H and the like used for exciting the gas supplied from the first gas supply unit in the processing space S is adjusted by the Ar gas injected through the central gas injection holes 41A and the peripheral gas injection holes 41B. Therefore, the Ar gas serving as the second gas may be referred to as a distribution adjusting gas for adjusting the distribution of the first gas.

In the processing space S, the SiN film is etched by the radicals such as F, $NF_2$, O, H and the like. Then, the wafer W is transferred to the PHT apparatus by the transfer unit 16 and subjected to heat treatment. Accordingly, residues generated by the etching process are sublimated and removed. Next, the wafer W is transferred to the load-lock chamber 13 in a vacuum atmosphere. An atmosphere in the load-lock chamber 13 is switched to an atmospheric atmosphere and, then, the wafer W is taken out from the load-lock chamber 13 by the transfer unit 15. The temperature of the wafer W is controlled by the cooling unit 14 and, then, the wafer W is returned to, e.g., the original transfer container C.

In accordance with the above embodiment, in the plasma processing apparatus for processing the wafer W by supplying a gas to the wafer W in the processing chamber, the processing chamber 20 is partitioned by the partition unit 5 into the plasma space P where the $NF_3$ gas, the 02 gas and the $H_2$ gas are excited and the processing space S where the radical treatment is performed on the wafer W. Then, the $NF_3$ gas, the $O_2$ gas and the $H_2$ gas excited in the plasma space P are supplied as radicals to the processing space S through the slits 53 and 54 formed in the ion trap unit 51 and the slits 42 formed in the shower plate 4 and, also, Ar gas is separately supplied from the bottom surface of the shower plate 4. The Ar gas is supplied by the central gas supply unit for supplying Ar gas from the central region side above the mounting table 3 and the peripheral gas supply unit for supplying Ar gas from the peripheral region side above the mounting table 3. Therefore, the supply amount of the Ar gas to the center portion of the mounting table 3 and the supply amount of the Ar gas to the peripheral portion of the mounting table 3 can be independently adjusted. Accordingly, it is possible to adjust the in-plane distribution of the radicals supplied to the wafer W. As a result, the in-plane distribution of the plasma processing of the wafer W can be adjusted.

Depending on the supply positions of the $NF_3$ gas, the $O_2$ gas, and the $H_2$ gas in the processing chamber 20, the concentration of the radicals of the $NF_3$ gas, the $O_2$ gas, and the $H_2$ gas may be increased at the central region in the processing space S. When the etching amount at the central region of the wafer W needs to be decreased, it is required to relatively increase the amount of Ar gas supplied from the central gas supply unit. Accordingly, the etching amount at the central region of the wafer W can be decreased compared to that at the peripheral region of the wafer W.

Further, since the shower plate 4 can be configured as the plate-shaped body 40, the scaling up of the apparatus can be avoided due to its thin thickness even in the case of using the shower plate 4 in combination with the ion trap unit 51.

In addition, there may be employed a plasma processing apparatus for supplying a processing gas for converting $NF_3$ gas or the like to a plasma into the plasma space P and supplying $NH_3$ gas or the like from the bottom surface of the shower plate 4 to the wafer W without converting it to a plasma. A plasma processing apparatus for removing an $SiO_2$ film by COR (chemical oxide removal) method may be used as an example thereof. In this plasma processing apparatus, $NH_4F$ that is an etchant is generated and adsorbed on the surface of the wafer W, and $NH_4F$ and $SiO_2$ are made to react to produce AFS (ammonium fluorosilicate). However, when $NH_3$ gas is turned into a plasma, $NH_4F$ is not generated. Therefore, $NF_3$ gas is supplied into the plasma space P and converted to a plasma. The $NH_3$ gas is supplied from the bottom surface of the shower plate 4 without passing through the plasma space P. In this example as well, by adjusting the supply amount of the $NH_3$ gas supplied through the central gas injection holes 41A and the supply amount of the $NH_3$ gas supplied through the peripheral gas injection holes 41B, the in-plane distribution of the $NH_3$ gas can be adjusted and the in-plane distribution of the supply amount of $NH_4F$ on the surface of the wafer W can be adjusted. Accordingly, the same effect can be obtained.

When the plasma collides with the ion trap unit 51, the ion trap unit 51 may accumulate heat. Radicals and the like passing through the ion trap unit 51 may be unevenly distributed due to the heat distribution. The distribution of radicals in the processing space S may be affected by the heat distribution of the ion trap unit 51. In the above embodiment, the shower plate 4 is formed of an aluminum plate. By providing a heat shield member such as an aluminum plate or the like below the ion trap unit 51, it is possible to block radiation of the heat of the ion trap unit 51 into the processing space S. Therefore, it is possible to suppress uneven distribution of the radicals in the processing space S due to the effect of the heat of the ion trap unit 51, and also possible to accurately adjust the concentration distribution of the radicals in the processing space S.

Since the shower plate 4 provided with the flange 400 is configured as a heat shield member and the flange 400 is made to be in contact with the processing chamber 20, the heat of the shower plate 4 is diffused through the processing chamber 20. Accordingly, the heat shield effect is improved. Further, since the central gas supply path 44 and the peripheral gas supply path 46 which supply the second gas are provided in the shower plate 4, the heat of the shower plate 4 can be more effectively diffused by allowing the gas to flow through the central gas supply path 44 and the peripheral gas supply path 46. In the ion trap unit 51, the heat distribution varies depending on the plasma distribution and the distribution of heat radiated to the processing space S also varies. Therefore, by independently supplying the gas to the central gas supply path 44 formed in the central portion of the shower plate 4 and the peripheral gas supply path 46 formed in the peripheral portion of the shower plate 4, the region where the gas flows through the shower plate 4 can be changed in accordance with the heat distribution of the ion trap unit 51. Accordingly, the heat of the shower plate 4 can be diffused more effectively.

As described with reference to FIG. 6, the peripheral gas introduction path 405 is connected to the position bisecting the gas diffusion passage 45 in the longitudinal direction and, thus, the flow rate of the gas in the right-left direction of the gas diffusion passage 45 can be distributed with high uniformity. Since the gas distributed from the gas diffusion passage 45 flows into each of the peripheral gas supply paths 46, the gas can be injected with high uniformity through the peripheral gas injection holes 41 formed at the downstream side of the peripheral gas supply path 46.

Here, in the peripheral gas introduction path 405, the gas flows toward one side in the right-left direction. Therefore, compared to the configuration in which a downstream end of the peripheral gas introduction path 405 is directly connected to the longitudinal center portion of the gas diffusion passage 45, i.e., the configuration in which a gas is introduced into the gas diffusion passage 45 without passing through the above-described connection passage 404, the configuration shown in FIG. 6 in which a gas is supplied to the connection passage 404, rectified in the direction normal to the circular arc and then introduced into the gas diffusion passage 45 is preferable because it allows the gas to be more uniformly diffused in the right-left direction in the gas diffusion passage 45.

In order to improve straightness of the gas by eliminating deflection of the gas flow in the connection passage 404 and increase uniformity of gas distribution in the gas diffusion passage 45, it is preferable that the width d of the connection passage 404 is smaller than the width D of the peripheral gas introduction path 405. Further, in order to eliminate the deflection of the gas flow in the connection passage 404 as described above, it is preferable that the connection passage 404 has a length L that is greater than the width d by twice or more (L≥2d) as described above.

It is also possible to expand the downstream end portion of the peripheral gas introducing passage 405 compared to the upstream end portion thereof and make the gas flowing into the connection flow passage 404 stagnate temporarily at the downstream end portion of the gas introducing passage 405 and then flow into the connection passage 404. With this configuration, it is possible to allow the gas to flow into the connection passage 404 at a reduced flow velocity. Accordingly, the straightness of the gas in the connection passage 404 is improved.

Figure 12:
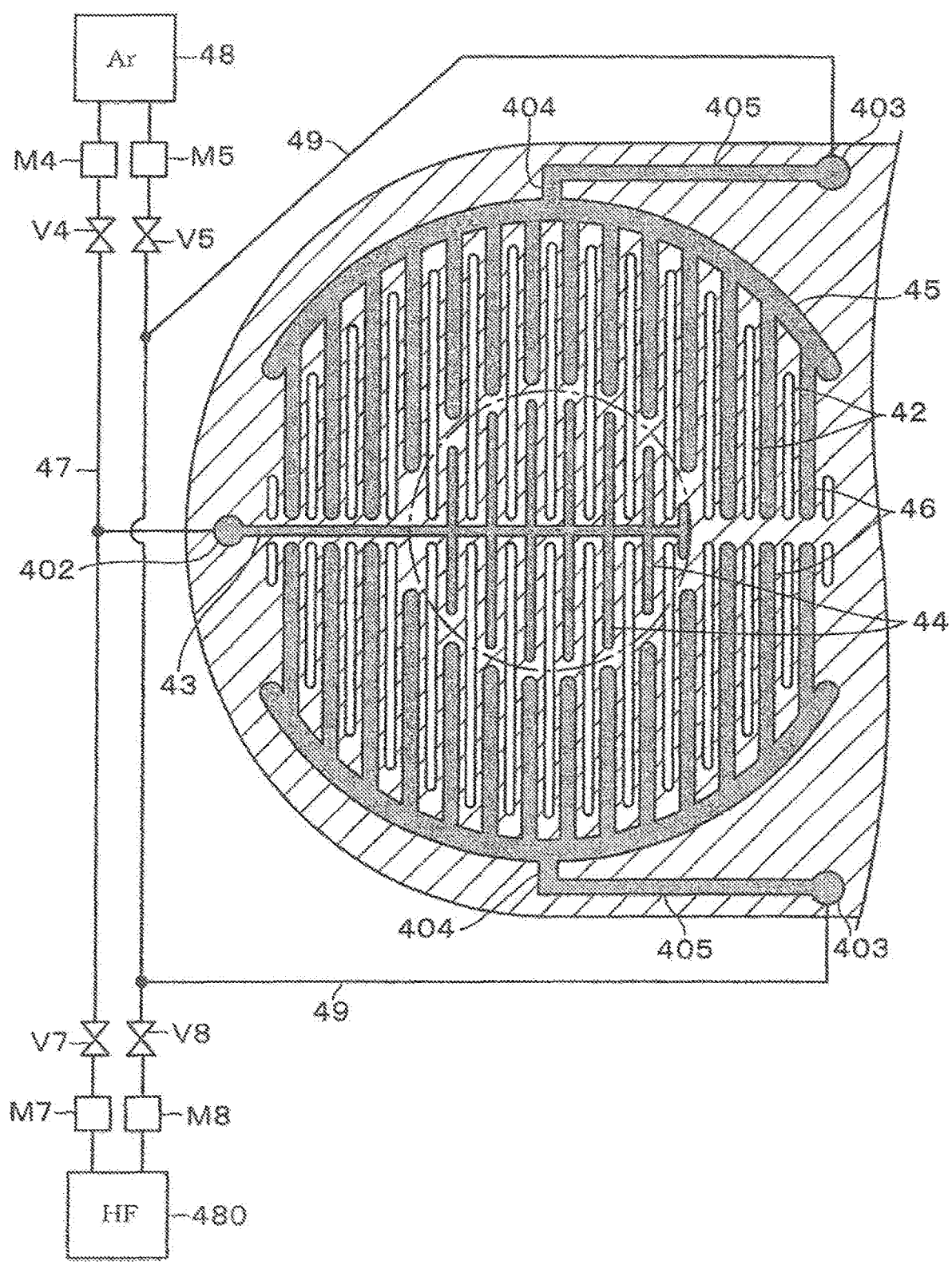
FIG. 12 explains a shower plate in another example of the embodiment.

In the present disclosure, the gas supplied through the central gas injection holes 41A and the peripheral gas injection holes 41B constituting the second gas supply unit may be switched among different kinds of gases. For example, as shown in FIG. 12, Ar gas and hydrogen fluoride (HF) gas for removing an oxide film can be independently supplied to the central gas introducing port 402 and the peripheral gas introduction port 403 constituting the second gas supply unit. A substrate processing apparatus 1A capable of supplying Ar gas and HF gas has the same configuration as that of the plasma processing apparatus 2, except in that Ar gas and HF gas can be supplied to the ports 402 and 403. In FIG. 12, a reference numeral 480 denotes a HF gas supply source; notations V7 and V8 denote valves; and notations M7 and M8 denote flow rate controllers.

Figure 13:
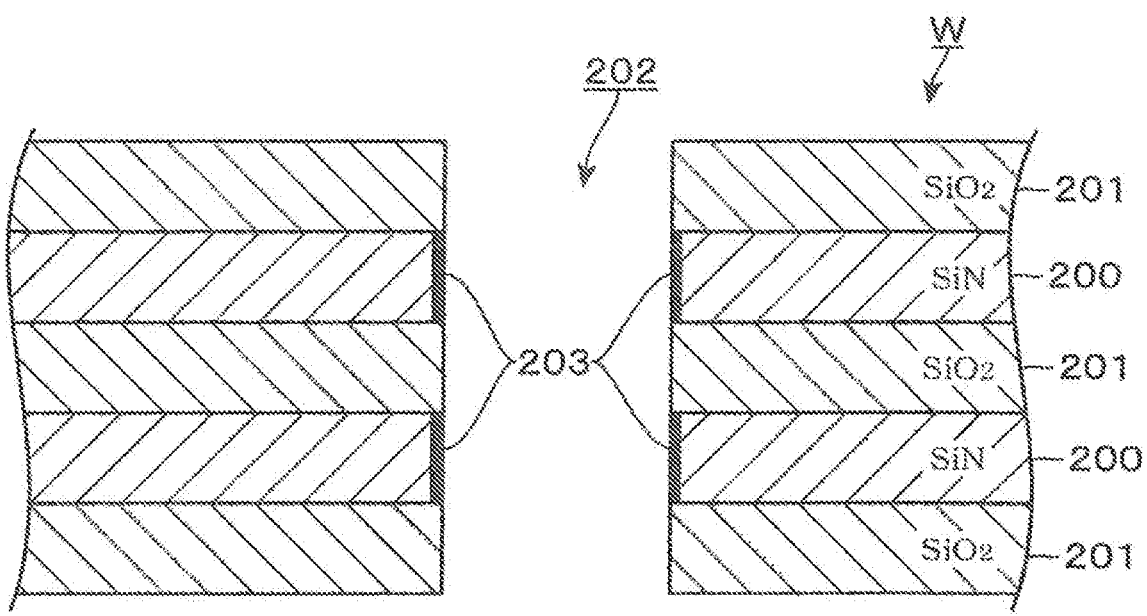
FIG. 13 is a cross sectional view of a wafer to be subjected to plasma processing of the present disclosure.

FIG. 13 shows the wafer W that is a target substrate to be processed by the substrate processing apparatus 1A. This wafer W is used for forming, e.g., a device having a 3D NAND structure. In this wafer W, a silicon nitride film (SiN film) 200 and a silicon oxide film ($SiO_2$ film) 201 are alternately laminated multiple times and a memory hole 202 is formed therethrough. Before the processing of the substrate processing apparatus 1A, a thin natural oxide film 203 is formed on surfaces of the SiN films 200 which form a sidewall of the memory hole 202. Hereinafter, the processing of the substrate processing apparatus 1A will be briefly described. After the natural oxide film 203 is removed, a surface layer of the SiN film 200 forming the sidewall of the memory hole 202 is etched. However, after this etching process, an oxide film may be formed on the surface of the SiN film 200. In that case, a film may not be normally filled in the memory hole 02 in a subsequence process. Therefore, in this substrate processing apparatus 1A, the oxide film is removed after the etching so that the film can be normally filled.

Figure 14:
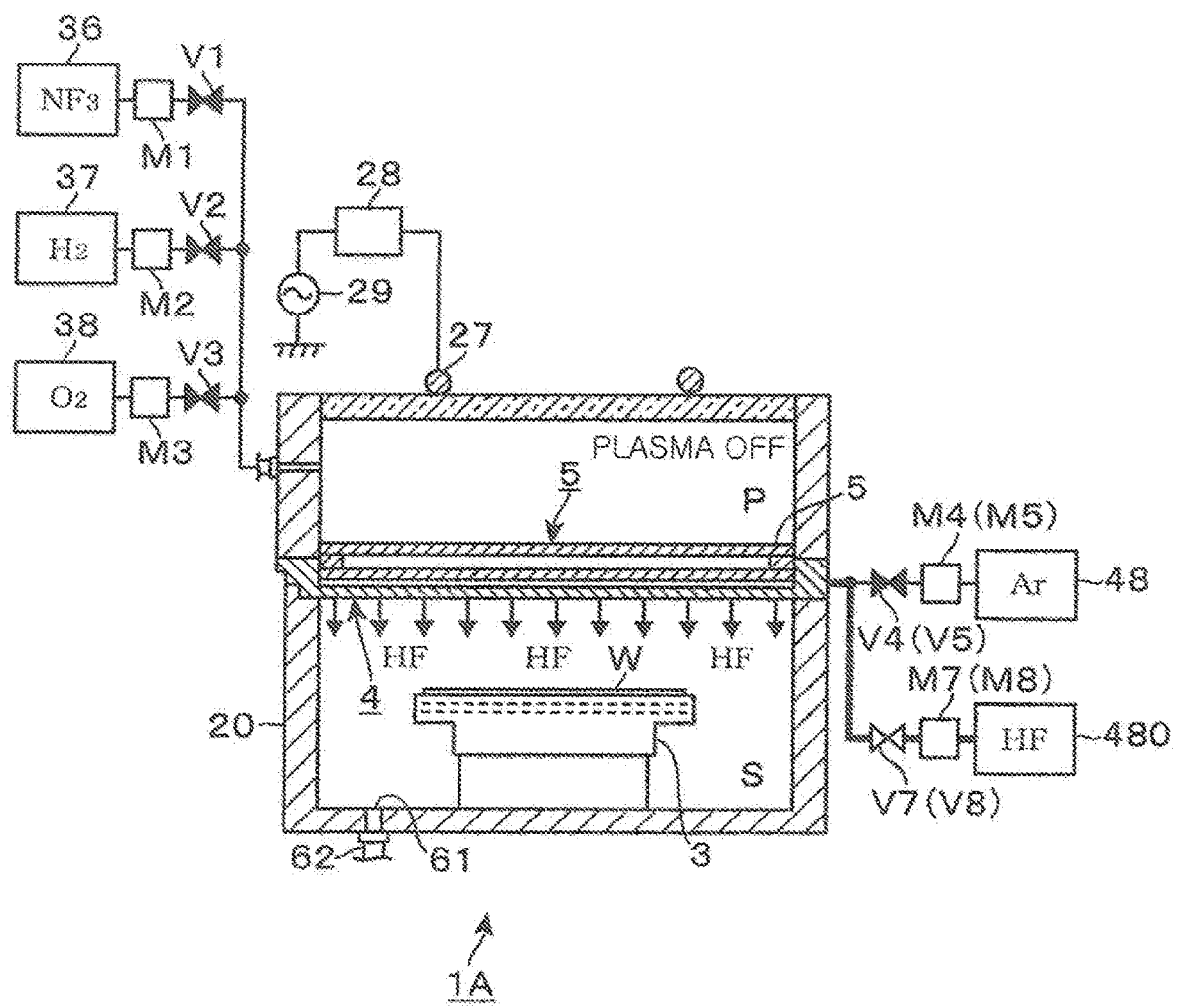
FIGS. 14 and 15 explain an operation of another example of the embodiment.
Figure 15:
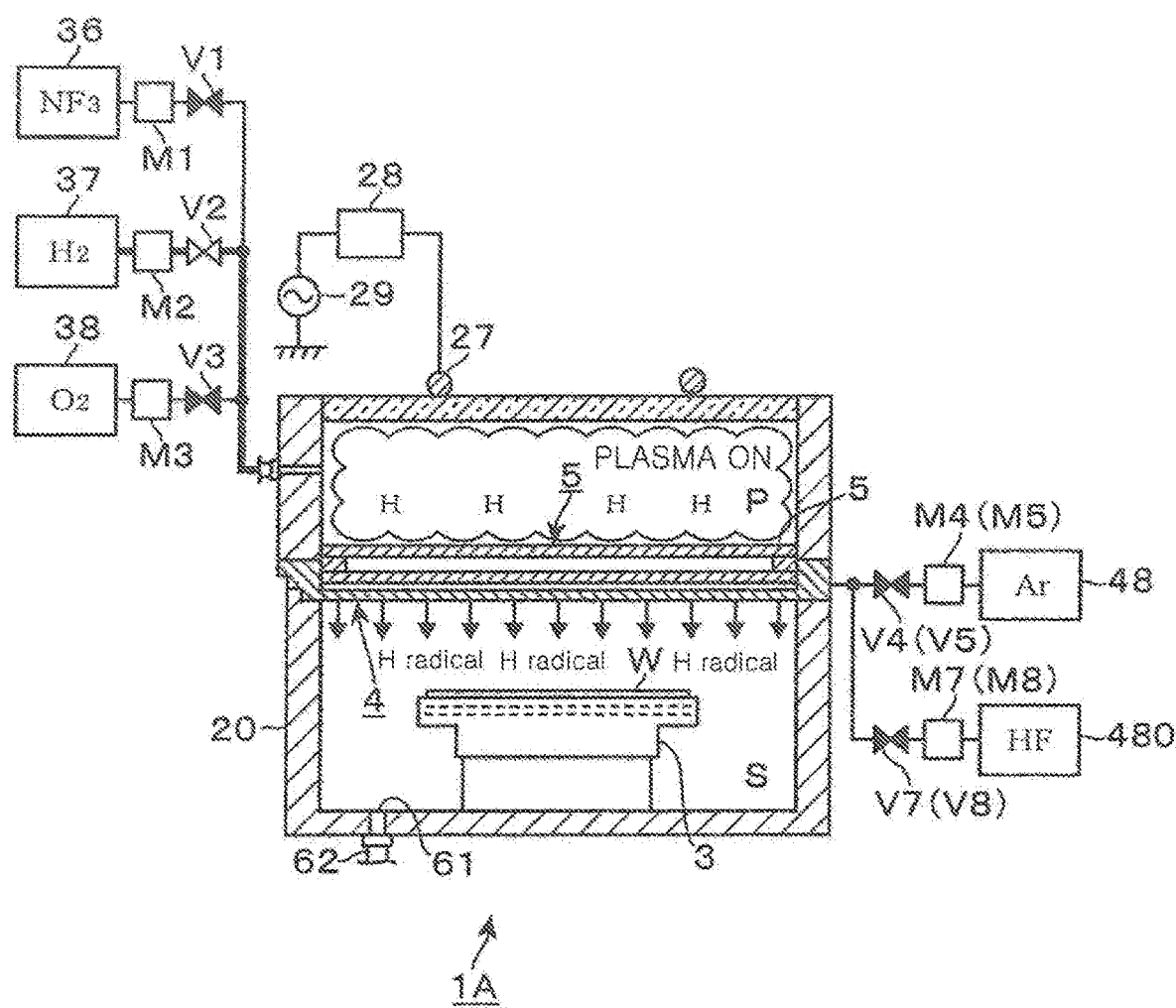

An example of substrate processing using this substrate processing apparatus 1A will be described in detail. First, when the wafer W shown in FIG. 13 is provided in the substrate processing apparatus 1A, the natural oxide film 203 on a side surface of the memory hole 202 is removed. In that case, the processing chamber 2 is exhausted and the high frequency power supply 29 is switched off. In that state, as shown in FIG. 4, HF gas is supplied into the processing space S through the central gas injection holes 41A and the peripheral gas injection holes 41B formed in the shower plate 4. In FIGS. 14 and 15, open valves are indicated in white and closed valves are Indicated in black. At this time, the flow rate of the HF gas supplied to the central gas introducing port 402 for introducing the gas to the central gas injection holes 41A may be the same as the flow rate of the HF gas supplied to the two peripheral gas introduction ports 403 for introducing the gas into the peripheral gas injection holes 41B. Due to the action of the HF gas supplied into the processing space S as described above, the natural oxide film 203 formed on the inner surface of the memory hole 202 is removed.

Next, as shown in FIG. 15, $H_2$ gas that is a modifying gas for modifying the SiN film 204 is supplied from the $H_2$ gas supply source 37 into the plasma space P, and the supply of the HF gas into the processing space S is stopped. The high frequency power supply 29 is switched on to excite the plasma. Therefore, $H_2$ gas is activated in the plasma space P, and H radicals are supplied to the wafer W. Due to the action of the H radicals, SiN bonds in the SiN film 200 are cut off. Accordingly, the SiN film 200 becomes to be easily etched (the SiN film 200 is modified).

Figure 16:
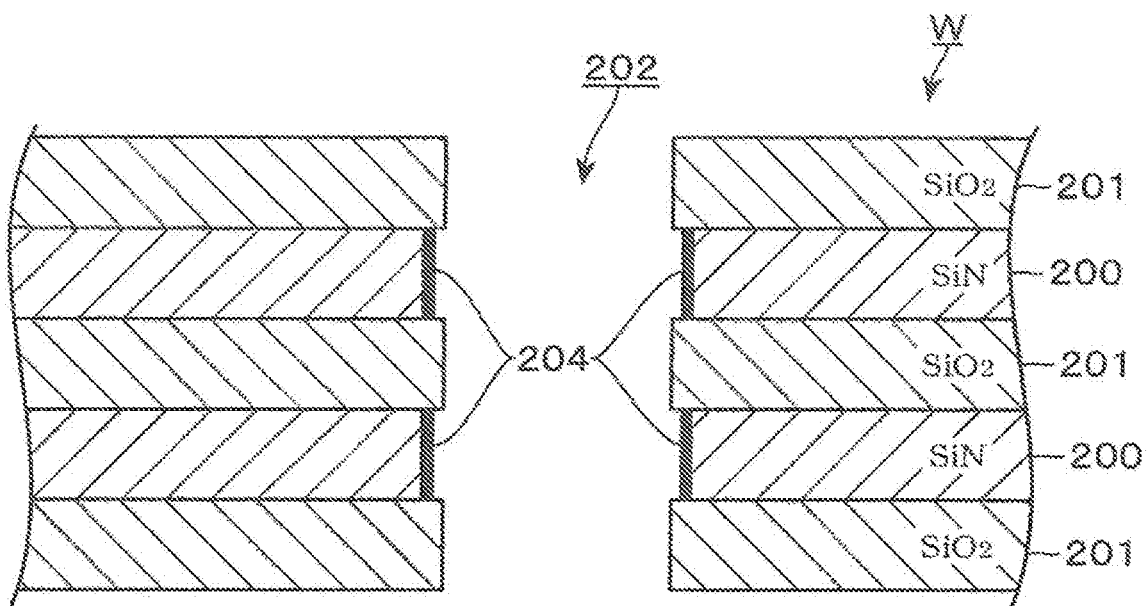
FIG. 16 is a cross sectional view of a wafer after an etching process.

Thereafter, as described with reference to FIGS. 10 and 11, the etching process of the SiN film 200 is performed as the processing of the plasma processing apparatus 2. Accordingly, the SiN film 200 forming the sidewall of each memory hole 202 is etched while ensuring high in-plane uniformity of the wafer W. When the SiN film 200 exposed in the memory hole 202 is etched to a thickness of several nm, the etching is completed. The etching of the SiN film 200 is performed to improve the fillability of a film filled in each memory hole 202. After the etching is completed, an oxide film 204 is formed on the surface of the SiN film 200 forming the side wall of the memory hole 202 by the action of $O_2$ gas used for the etching, as shown in FIG. 16.

Therefore, as for after-treatment, as in the process of removing the natural oxide film 203, the supply of the gas into the plasma space P is stopped and HF gas is supplied through the gas injection holes 41A and 41B of the shower plate 4 in a state where the high frequency power supply 29 is switched off as shown in FIG. 14. Accordingly, the oxide film 204 formed on the surface of the SiN film 200 can be removed.

After the removal of the oxide film 204, the wafer W is heated and residues adhered to the wafer W are removed as described in the above embodiment, for example. The heating of the wafer W may be performed by the PHT apparatus as described above or may be performed by the substrate processing apparatus 1A including a heating unit provided at the mounting table 3.

By using the substrate processing apparatus 1A, the SiN film 200 can be etched with high uniformity in the plane of the wafer W. In addition, since the oxide film 204 on the surface of the SiN film 200 is removed after the etching, it is possible to allow the film to be normally filled in the memory hole 202.

By using the substrate processing apparatus 1A, a series of substrate processing such as the removal of the natural oxide film 203, the pre-treatment for making the etching easier by cutting off the SiN bonds, and the removal of the oxide film 204 after the etching can be performed in the same processing chamber 20. Therefore, when the above-described series of substrate processing is performed, it is not necessary to transfer the wafers W between the multiple processing chambers 20, which makes is possible to improve the throughput. Only the removal of the natural oxide film 203 and the etching may be performed by the substrate processing apparatus 1A. Alternatively, only the etching and the removal of the oxide film 204 may be performed in the substrate processing apparatus 1A.

In the removal of the natural oxide film 203 as the pre-treatment of the etching or the removal of the oxide film 204 as the post-treatment of the etching, $NH_3$ gas may be supplied together with the HF gas. The gas supply port 34, the gas supply line 35 for supplying the gas to the gas supply port 34, the valves V1 to V3, the flow rate controllers M1 to M3, and the gas supply sources 36 to 38 constitute the first gas supply unit. The central gas injection holes 41A, the peripheral gas injection holes 41B, the valves V4 and V5 for supplying gas to the central gas injection holes 41A and the peripheral gas injection holes 41B, the flow rate controllers M4 and M5 and the Ar gas supply source 48 constitute the second gas supply unit. The HF gas and the $NH_3$ gas may be supplied from any one of the first gas supply unit or the second gas supply unit. The modifying gas may be $NH_3$ or $H_2O$.

(Second Embodiment)

Figure 17:
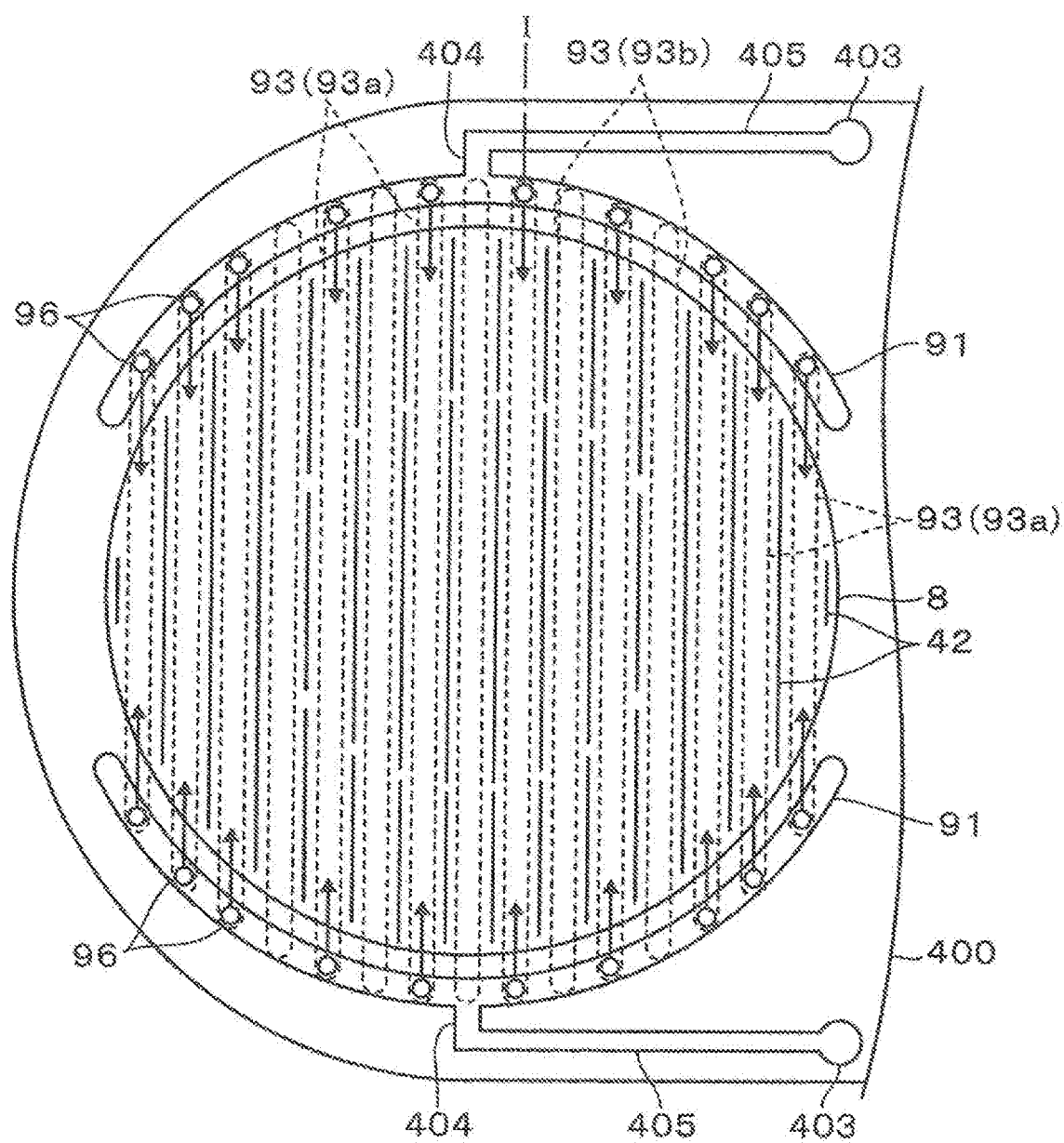
FIG. 17 is a plan view showing a top surface of a shower plate according to a second embodiment.
Figure 18:
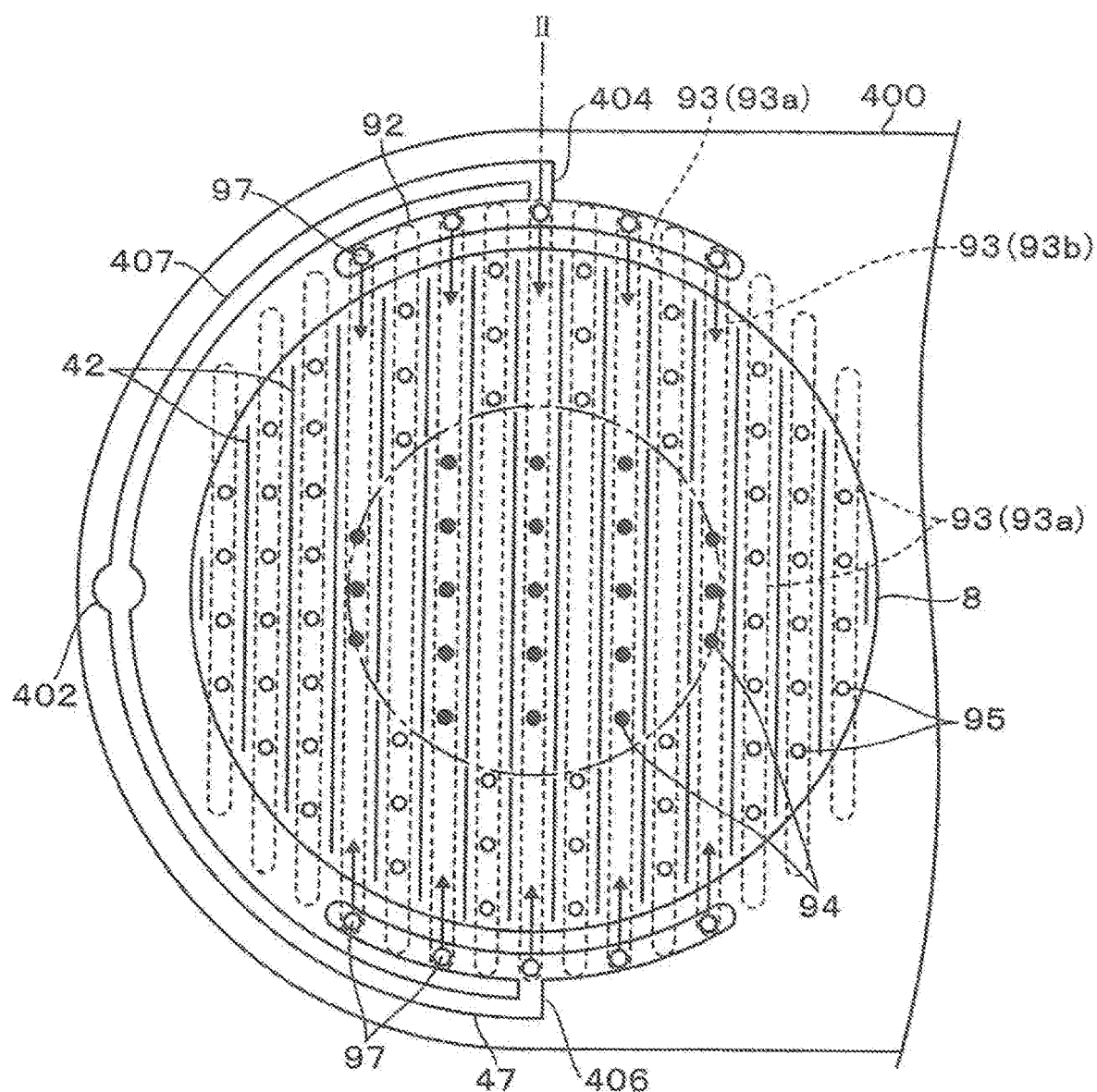
FIG. 18 is a plan view showing a bottom surface of the shower plate according to the second embodiment.
Figure 19:
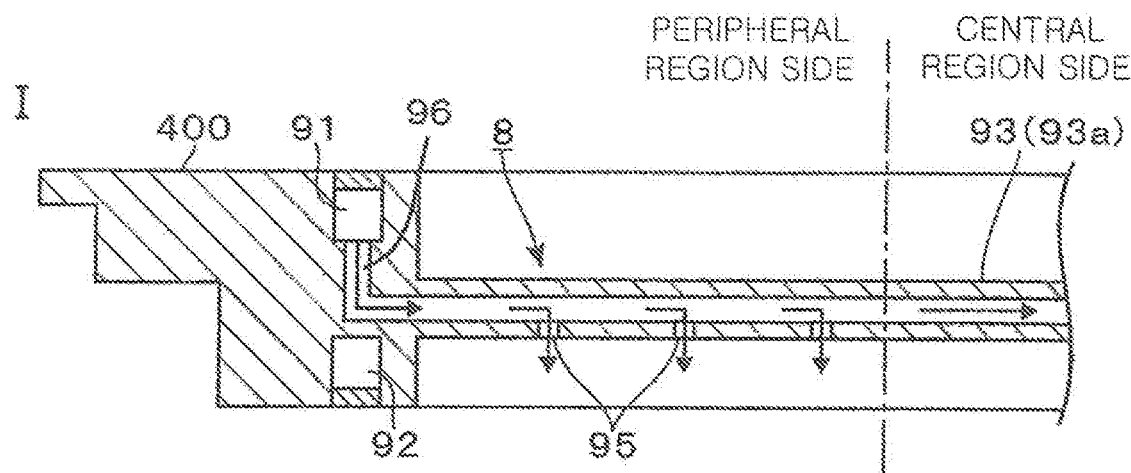
FIGS. 19 and 20 are vertical cross sectional views of the shower plate according to the second embodiment.
Figure 20:
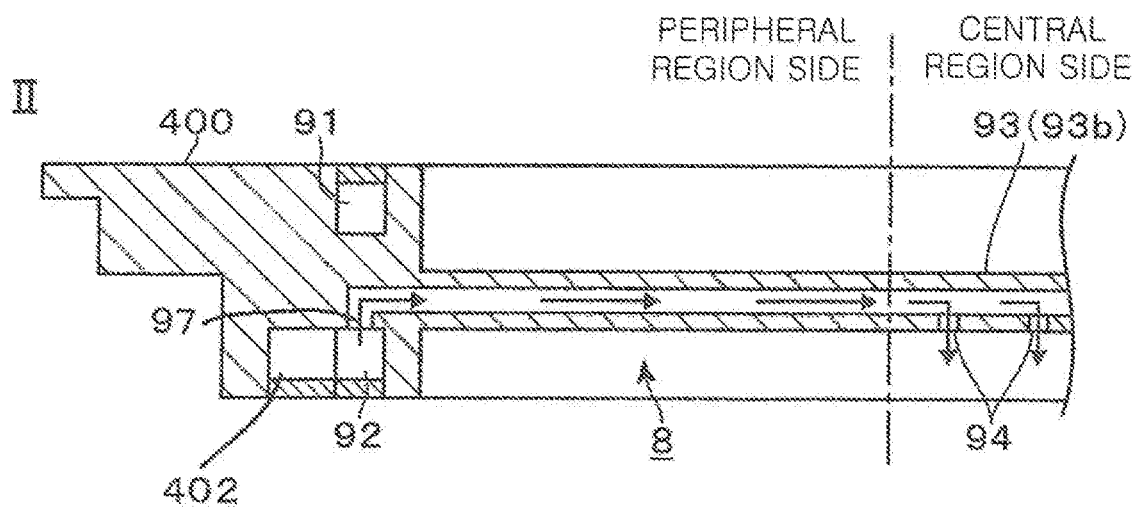

A substrate processing apparatus according to a second embodiment will be described. This substrate processing apparatus has the same configuration as that of the plasma processing apparatus 2 shown in FIG. 2 except in the configuration of a shower plate 8 forming a part of the partition unit 5. The shower plate 8 of the substrate processing apparatus according to the second embodiment will be described with reference to FIGS. 17 to 20. In order to avoid complicated description, the slits 42 penetrating through the shower plate 8 is indicated by black lines. FIGS. 17 and 18 are plan views of the shower plate 8 when viewed from the top and the bottom, respectively. FIGS. 19 and 20 are vertical cross sectional views of the shower plate 8 which are taken along lines I and II shown in FIGS. 17 and 18, respectively.

As shown in FIGS. 17, 19 and 20, a peripheral gas diffusion passage 91 for diffusing Ar gas injected from the peripheral portion of the bottom surface of the shower plate 8 in the right-left direction is formed in the flange 400 at the front side and the rear side of the shower plate 8 on the top surface (facing the plasma space P) of the shower plate 8. As shown in FIGS. 18 to 20, a central gas diffusion passage 92 for diffusing Ar gas injected from the central portion of the bottom surface of the shower plate 8 in the right-left direction is formed in the flange 400 at the front side and the rear side of the shower plate 8 on the bottom surface of the shower plate 8. In addition, gas channels 93 penetrating through the shower plate 8 in the back-and-forth direction are arranged in the shower plate 8 in the right-left direction. The gas channels 93 are formed such that the end portions thereof are positioned below the peripheral gas diffusion passage 91 at a position higher than a height position where the central gas diffusion passage 92 is formed in the flange 400. In FIGS. 17 and 18, the top surface of the peripheral gas diffusion flow passage 91 and the bottom surface of the central gas diffusion flow passage 92 are opened. However, as shown in FIGS. 19 and 20, the top surface of the peripheral gas diffusion flow and the bottom surface of the central gas diffusion passage 92 are covered by a plate-shaped member.

In the gas channels disposed at the inner side (the gas channels 93 traversing the central region), among the gas channels 93, arranged in the right-left direction, a gas channel 93a connected to the peripheral gas diffusion passage 91 through a communication path 96 formed on the upper surface of each of the front end and the rear end of the gas channel 93a and a gas channel 93b connected to the central gas diffusion passage 92 through a communication path 97 formed on the bottom surface of each of the front end and the rear end of the gas channel 93b, are alternately arranged. The gas channels disposed at the outer side (the gas channels 93 not traversing the central region), among the gas channels 93, include only the gas channels 93a connected to the peripheral gas diffusion passage 91 through the communication path 96 formed on the upper surface of each of the front end and the rear end of the gas channel 93a.

As shown in FIGS. 18 and 19, each of the gas channels 93a connected to the peripheral gas diffusion passage 91 has a plurality of injection holes 95 formed in the peripheral region of the bottom surface of the shower plate 8. As shown in FIGS. 18 and 20, each of the gas channels 93b connected to the central gas diffusion passage 92 has a plurality of injection holes 94 formed in the central region of the bottom surface of the shower plate 8.

The peripheral gas diffusion passage 91 is connected to the peripheral gas introduction port 403 via the connection passage 404 and the peripheral gas introducing passage 405, as in the case of the peripheral gas diffusion passage 45 of the shower plate 4 shown in FIG. 6. The peripheral gas supply line 49 shown in FIG. 6, for example, is connected to the peripheral gas introduction port 403 and Ar gas is supplied to the gas channel 93a via the peripheral gas diffusion passage 91. The central gas diffusion passage 92 is also connected to the central gas introducing port 402 via the connection passage 406 and the central gas introduction path 407. As in the case of the connection passage 404, the connection passage 406 is perpendicular to the central gas introduction path 407 and the central gas diffusion passage 92. The width of the connection passage 406 is smaller than the width of the central gas introduction path 407, and the length of the connection passage 406 is greater than the width of the connection passage 406 by twice or more.

The central gas supply line 47 shown in FIG. 6, for example, is connected to the central gas introducing port 402 and Ar gas is supplied to the gas channel 93b via the central gas diffusion passage 92. The slits 42 for supplying a first gas, e.g., radicals, excited in the plasma space P to the processing space S are formed at the gap between the adjacent gas channels 93 (93a and 93b) in the shower plate 8.

As in the case of the shower plate 4 shown in the first embodiment, in the shower plate 8, the gas supplied from the peripheral gas supply line 49 is diffused by the peripheral gas diffusion passage 91 such that the flow rate becomes uniform in the arrangement direction of the gas channels 93a and then supplied to the gas channels 93a. The gas supplied from the central gas supply line 47 is diffused in the central gas diffusion passage 92 such that the flow rate becomes uniform in the arrangement direction of the gas channels 93b and then supplied to the gas channels 93b. Therefore, not only the gas supplied to the peripheral region of the shower plate 8 but also the flow rate of the gas supplied to the central region become uniform in the arrangement direction of the gas channel 93b (the right-left direction).

Accordingly, the second gas supplied from the center region of the shower plate 8 and the second gas supplied from the peripheral region can be uniformly injected. As a result, the in-plane distribution of the second gas supplied to the central portion and the peripheral portion of the wafer W can become uniform and the in-plane uniformity of the second gas supplied to the wafer W can be more accurately adjusted.

(Third Embodiment)

Figure 21:
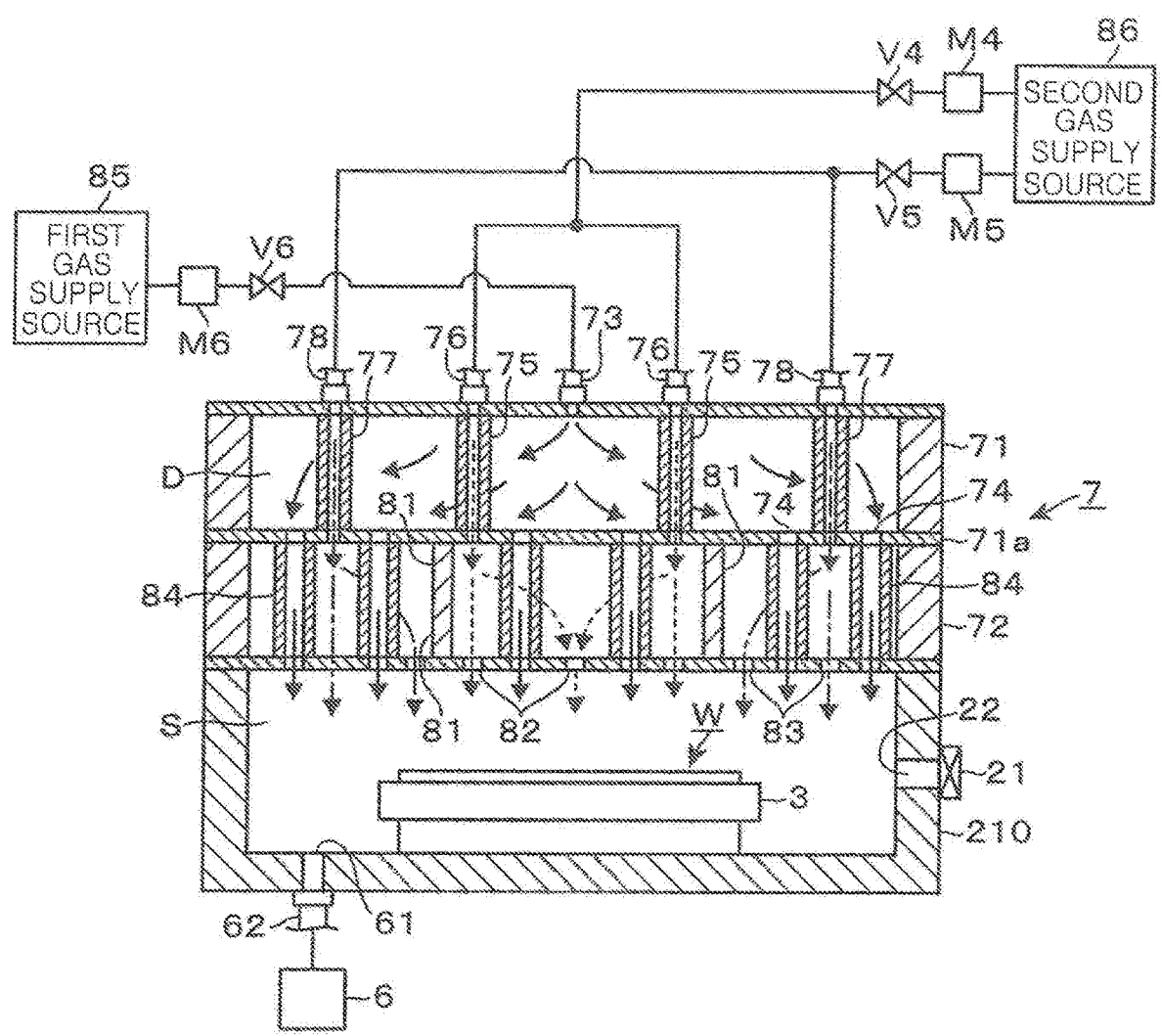
FIG. 21 is a vertical cross sectional view of a substrate processing apparatus according to a third embodiment.

In the present invention, there may be employed a substrate processing apparatus including a diffusion space where gases are pre-mixed, instead of a plasma space where a gas is turned into a plasma. Hereinafter, a substrate processing apparatus for performing processing by supplying gases, e.g., $NF_3$ gas, Ar gas, $O_2$ gas, $H_2$ gas and the like, which have been pre-mixed into the processing space and supplying a gas for post mix, e.g., HF gas, $NH_3$ gas or the like, directly to the processing space, will be described. The gas treatment unit for performing gas treatment on the wafer W may have a configuration in which two processing chambers 20 are connected as in the case of the above-described plasma processing apparatus. Here, an example in which a single processing chamber 210 is provided will be described. As shown in FIG. 21, the substrate processing apparatus includes a cylindrical processing chamber 210 and a shower head 7 provided at a ceiling plate of the processing chamber 210. Reference numerals 21 and 22 denote a gate valve and a transfer port, respectively. Reference numerals 61, 62 and 6 denote a gas exhaust port, a gas exhaust line and a vacuum evacuation unit, respectively, which are the same as those of the plasma processing apparatus 2. A mounting table 3 is provided in the processing chamber, as in the case of the plasma processing apparatus 2.

Figure 22:
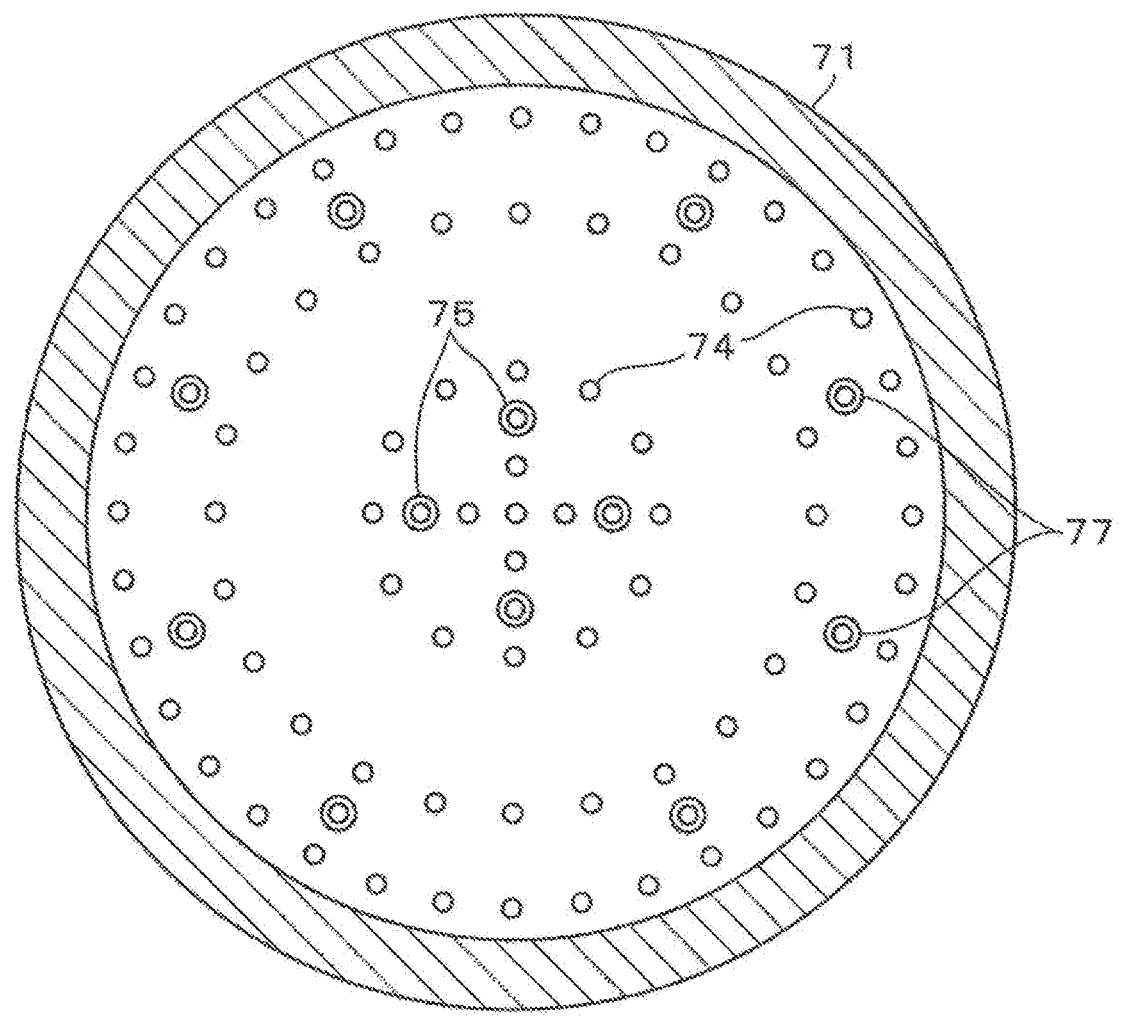
FIGS. 22 and 23 are plan views of a shower head according to the third embodiment.
Figure 23:
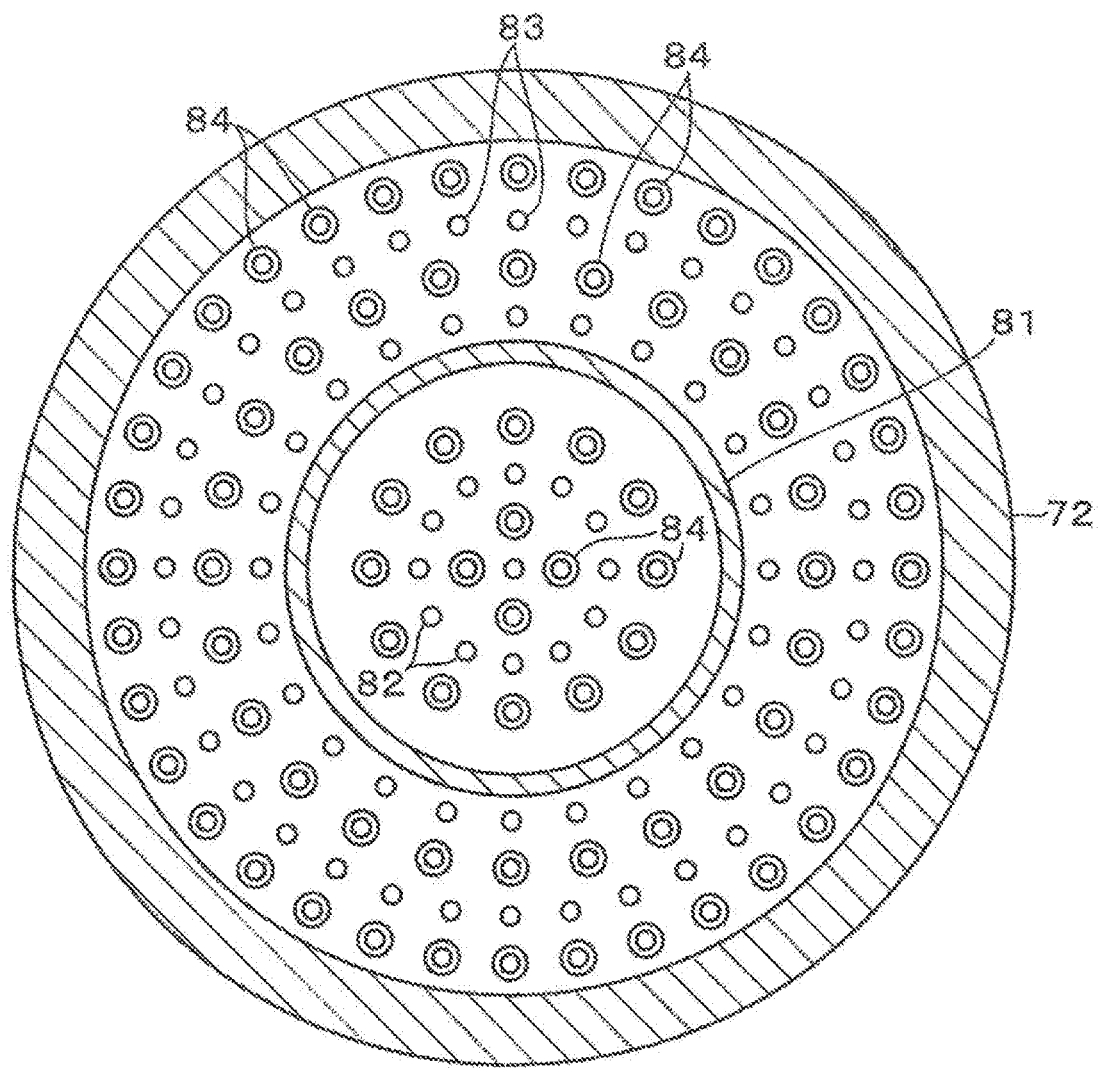

The configuration of the shower head 7 will be described with reference to FIGS. 21 to 23. The shower head 7 includes a diffusion member 71 defining a diffusion space D for diffusing the first gas and a shower member 72 for injecting a gas into the processing space S. As shown in FIG. 21, the shower head 72 and the diffusion member 71 are stacked in that order from the mounting table 3 side. A bottom plate 71a of the diffusion member 71 and the shower member 72 correspond to a partition unit for partitioning the processing space S for processing the wafer W and the diffusion space D for diffusing a gas. FIGS. 21 to 23 are schematic diagrams, and the arrangement and the number of the injection holes are not accurately illustrated.

As shown in FIGS. 21 and 22, the diffusion member 71 is formed in a flat cylindrical shape in which a diffusion chamber for diffusing a gas is formed. A downstream end portion of the first gas supply line 73 for supplying the first gas, e.g., $NF_3$ gas, Ar gas, $O_2$ gas, $H_2$ gas or the like, into the diffusion member 71 is connected to the top plate of the diffusion member 71. Holes 74 for injecting the gas diffused in the diffusion member 71 are formed through the bottom plate 71a of the diffusion member 71. A first gas supply source 85 for mixing gases such as $NF_3$ gas, Ar gas, $O_2$ gas, $H_2$ gas and the like and supplying a mixture thereof to the first gas supply line 73 is connected to the upstream side of the first gas supply line 73. In FIG. 21, notations V6 and M6 denote a valve and a flow rate controller, respectively. In this example, the first gas is supplied through a single gas inlet into the diffusion member 71. However, it is also possible to introduce a plurality of gases into the diffusion space D through respective individual gas inlets, for example. In that case, the plurality of gases may be mixed in the diffusion space D.

As shown in FIGS. 21 and 22, central gas supply lines 75 are provided at a central portion in the diffusing member 71 when viewed from the top. The central gas supply line 75 is configured to supply the second gas for post mix, e.g., HF gas, $NH_3$ gas or the like, which through the second gas supply line 76 connected to the top plate of the diffusion member 71, to the central region of the shower member 72 to be described later without being diffused in the diffusion space. Further, peripheral gas supply lines 77 are provided at a peripheral portion in the diffusion member 71. The peripheral gas supply line 77 is configured to supply the second gas, which is fed through the second gas supply line 78 connected to the top plate, to the peripheral region of the shower member 72 to be described later without being diffused in the diffusion space. A reference numeral 86 denotes a second gas supply source of the second gas for post mix, such as HF gas, $NH_3$ gas, or the like. Notations V4 and V5 in FIG. 21 denote valves provided in the second gas supply lines 76 and 78, respectively. Notations M4 and M5 denote flow rate controllers provided in the second gas supply lines 76 and 78, respectively.

As shown in FIGS. 21 and 23, the shower member 72 is a cylindrical member having a flat bottom. A shower space is formed by closing an upper portion of the shower member 72 by the bottom plate 71a of the diffusion member 71. The shower space is partitioned into a central region and a peripheral region by a partition wall 81. The second gas supplied to the shower space through the central gas supply line 75 of the diffusion member 71 flows into the central region surrounded by the partition wall 81 in the shower space as indicated by dashed arrows in FIG. 21. Then, the second gas flows into the processing space S through central gas injection holes 82 formed in the bottom surface of the central region surrounded by the partition wall 81 and then is injected toward the wafer W mounted on the mounting table 3.

The second gas supplied to the shower space through the peripheral gas supply line 77 of the diffusion member 71 flows into the peripheral region outer than the partition wall 81 in the shower space, as indicated by dashed-dotted arrows in FIG. 21. Then, the second gas flows into the processing space S through peripheral gas injection holes 83 formed in the bottom surface of the peripheral region outer than the partition wall 81 and then is injected toward the wafer W mounted on the mounting table 3.

Gas supply lines 84 are provided in the shower space to correspond to the holes 74 formed in the bottom plate 71a of the diffusion member 71. As indicated by solid arrows in FIG. 21, the first gas discharged through the holes 74 of the diffusion member 71 is injected downward from the shower member 72 without being diffused in the shower space. The holes 74 and the gas supply lines 84 correspond to the first gas injection holes. In this substrate processing apparatus as well, the first gas can be diffused in the diffusion space D and injected into the processing space S, and the second gas can be independently supplied into the processing space S from the central region and the peripheral region in the shower member 72 without passing through the diffusion space. Therefore, the concentration distribution of the second gas in the processing chamber 20 can be adjusted. Accordingly, the same effect can be obtained.

While the present disclosure has been shown and described with respect to the embodiments, it will be understood by those skilled in the art that various changes and modifications may be made without departing from the scope of the present disclosure as defined in the following claims.

What is claimed is:

1. A substrate processing apparatus for processing a substrate mounted on a mounting table in a processing chamber by supplying a gas to the substrate, the apparatus comprising:

a partition unit provided, between a processing space where a substrate is provided and a diffusion space where a first gas is diffused, to face the mounting table;

a first gas supply unit configured to supply the first gas to the diffusion space;

a plurality of first gas injection holes formed through the partition unit in a thickness direction thereof and configured to inject the first gas diffused in the diffusion space into the processing space; and a second gas supply unit including a plurality of second gas injection holes opened on a gas injection surface of the partition unit which faces the processing space and configured to independently supply a second gas to each of a plurality of regions arranged in a horizontal direction in the processing space separately from the first gas, wherein the plurality of regions includes a central region about a central axis of the substrate and a peripheral region surrounding the central region, wherein the second gas supply unit includes a central gas supply unit configured to supply the second gas to the central region and a peripheral gas supply unit configured to supply the second gas to the peripheral region, wherein the partition unit is a plate-shaped body, wherein the central gas supply unit includes a gas introducing port for a central region formed in a peripheral portion of the plate-shaped body and a central gas channel for the central region where the second gas injection holes are opened, the central gas channel having one end formed in the plate-shaped body to communicate with the gas introducing port for the central region and another end led to the central region of the plate-shaped body along the gas injection surface, and wherein the peripheral gas supply unit includes a gas introducing port for a peripheral region formed in a peripheral portion of the plate-shaped body and a peripheral gas channel for the peripheral region where the second gas injection holes are opened, the peripheral gas channel having one end formed in the plate-shaped body to communicate with the gas introducing port for the peripheral region and the other end led to the peripheral region of the plate-shaped body along the gas injection surface.

2. The substrate processing apparatus of claim 1, wherein the other end of the central gas channel is led to the central region of the plate-shaped body and the central gas channel is branched in the central region.

3. The substrate processing apparatus of claim 1, wherein the central gas channel includes a plurality of central gas channels and the peripheral gas channel includes a plurality of peripheral gas channels, wherein a gas diffusion passage for the central region through which a gas is diffused and supplied to each of the central gas channels and a gas diffusion passage for the peripheral region through which a gas is diffused and supplied to each of the peripheral gas channels are provided at different height positions of the partition unit, and a height direction of the partition unit is set to a thickness direction of the partition unit, wherein each of the plurality of central gas channels and each of the plurality of peripheral gas channels are extending along the gas injection surface, and wherein the plurality of central gas channels and the plurality of peripheral gas channels are arranged in the partition unit in the horizontal direction.

4. The substrate processing apparatus of claim 1, wherein the first gas is a processing gas for processing a substrate and the second gas is an inert gas.

5. The substrate processing apparatus of claim 1, further comprising: a plasma generation unit configured to activate the first gas supplied into the diffusion space.

6. The substrate processing apparatus of claim 5, further comprising: an ion trap unit provided closer to the diffusion space compared to the first gas injection holes and having therein a gas channel communicating with the first gas injection holes, the ion trap unit serving to trap ions in the activated first gas.

7. The substrate processing apparatus of claim 6, wherein the partition unit includes a heat shield member configured to suppress transfer of heat of the ion trap unit to the processing space.

8. The substrate processing apparatus of claim 7, wherein the heat shield member and the processing chamber are made of metal and brought into contact with each other.

9. The substrate processing apparatus of claim 7, wherein in the partition unit, a gas channel through which the second gas flows is formed through the heat shield member.

10. The substrate processing apparatus of claim 5, wherein the first gas serves as an etching gas for etching a silicon nitride film formed on a surface of the substrate, and the second gas serves as a distribution adjusting gas for adjusting distribution of the first gas in the processing space.

11. The substrate processing apparatus of claim 10, wherein an oxide film removing gas for removing an oxide film on a surface of the silicon nitride film before or after the etching is supplied from the first gas supply unit into the processing space through the diffusion space or is supplied from the second gas supply unit into the processing space.

12. The substrate processing apparatus of claim 10, wherein the first gas supply unit supplies a modifying gas for modifying the silicon nitride film into the diffusion space before the etching gas is supplied into the diffusion space, and the plasma generation unit activates the modifying gas.

13. A substrate processing method for the substrate processing apparatus disclosed in claim 1, the method comprising: etching a silicon nitride film formed on a surface of the substrate by activating the first gas supplied into the diffusion space and supplying the activated first gas into the processing space; adjusting distribution of the activated first gas in the processing space by supplying the second gas to the plurality of regions in the processing space; and supplying an oxide film removing gas for removing an oxide film on the surface of the silicon nitride film from the first gas supply unit to the processing space through the diffusion space or from the second gas supply unit to the processing space.

14. The substrate processing method of claim 13, further comprising: between said etching and said adjusting, supplying an oxide film removing gas for removing an oxide film on the surface of the substrate from the first gas supply unit to the processing space through the diffusion space or from the second gas supply unit to the processing space.

15. The substrate processing method of claim 13, further comprising: between said etching and said adjusting, supplying a modifying gas for modifying the silicon nitride film into the diffusion space from the first gas supply unit; and activating the modifying gas and supplying the activated modifying gas to the substrate.

16. The substrate processing apparatus of claim 1, wherein the central gas supply unit includes a connection passage for the central region to connect the gas introducing port for the central region to the gas diffusion passage for the central region, the connection passage for the central region is perpendicular to the gas introducing port for the central region and the gas diffusion passage for the central region, the peripheral gas supply unit includes a connection passage for the peripheral region to connect the gas introducing port for the peripheral region to the gas diffusion passage for the peripheral region, and the connection passage for the peripheral region is perpendicular to the gas introducing port for the peripheral region and the gas diffusion passage for the peripheral region.

17. The substrate processing apparatus of claim 16, wherein a width of the connection passage for the central region is smaller than a width of the gas introducing port for the central region, and a length of the connection passage for the central region is greater than the width of the connection passage for the central region by twice or more, a width of the connection passage for the peripheral region is smaller than a width of the gas introducing port for the peripheral region, and a length of the connection passage for the peripheral region is greater than the width of the connection passage for the peripheral region by twice or more.

18. The substrate processing apparatus of claim 3, wherein the plurality of central gas channels and the plurality of peripheral gas channels are positioned between the gas diffusion passage for the central region and the gas diffusion passage for the peripheral region in the height direction.

* * * * *